(12) United States Patent
Kim et al.

(10) Patent No.: US 11,697,764 B2
(45) Date of Patent: Jul. 11, 2023

(54) QUANTUM DOTS, AND COMPOSITE AND DISPLAY DEVICE INCLUDING THE SAME

(71) Applicant: SAMSUNG ELECTRONICS CO., LTD., Suwon-si (KR)

(72) Inventors: Tae Gon Kim, Hwaseong-si (KR);
Jongmin Lee, Hwaseong-si (KR);
Jooyeon Ahn, Suwon-si (KR);
Hyeyeon Yang, Suwon-si (KR); Shin Ae Jun, Seongnam-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 187 days.

(21) Appl. No.: 17/199,616

(22) Filed: Mar. 12, 2021

(65) Prior Publication Data

US 2021/0284908 A1 Sep. 16, 2021

(30) Foreign Application Priority Data

Mar. 13, 2020 (KR) .................. 10-2020-0031617

(51) Int. Cl.
| | |
|---|---|
| *C09K 11/70* | (2006.01) |
| *C09K 11/02* | (2006.01) |
| *C09K 11/62* | (2006.01) |
| *C22C 30/06* | (2006.01) |
| *G02F 1/017* | (2006.01) |
| *B82Y 30/00* | (2011.01) |
| *H10K 59/38* | (2023.01) |
| *B82Y 20/00* | (2011.01) |
| *B82Y 40/00* | (2011.01) |
| *G02F 1/13357* | (2006.01) |

(52) U.S. Cl.
CPC ............ *C09K 11/703* (2013.01); *B82Y 30/00* (2013.01); *C09K 11/025* (2013.01); *C09K 11/623* (2013.01); *C22C 30/06* (2013.01); *G02F 1/01791* (2021.01); *H10K 59/38* (2023.02); *B82Y 20/00* (2013.01); *B82Y 40/00* (2013.01); *G02F 1/133617* (2013.01)

(58) Field of Classification Search
CPC ... C09K 11/025; C09K 11/623; C09K 11/703; B82Y 20/00; B82Y 40/00; B82Y 30/00; G02F 1/133617; G02F 1/01791
See application file for complete search history.

(56) References Cited

U.S. PATENT DOCUMENTS

| | | |
|---|---|---|
| 7,476,487 B2 | 1/2009 | Park et al. |
| 7,746,423 B2 | 6/2010 | Im et al. |
| 9,196,682 B2 | 11/2015 | Jang et al. |
| 10,126,587 B2 | 11/2018 | Chung |
| 10,246,634 B2 | 4/2019 | Yang et al. |
| 10,520,765 B2 | 12/2019 | Chung |
| 10,533,127 B2 | 1/2020 | Park et al. |
| 10,689,511 B2 | 6/2020 | Ahn et al. |
| 10,782,611 B2 | 9/2020 | Yang et al. |
| 10,851,297 B2 | 12/2020 | Kim et al. |
| 10,889,755 B2 | 1/2021 | Youn et al. |
| 2017/0052444 A1 | 2/2017 | Park et al. |
| 2018/0105739 A1 | 4/2018 | Kim et al. |
| 2018/0119007 A1 | 5/2018 | Ippen et al. |
| 2019/0185743 A1 | 6/2019 | Kim et al. |
| 2019/0211260 A1 | 7/2019 | Won et al. |
| 2020/0040255 A1 | 2/2020 | Park et al. |

FOREIGN PATENT DOCUMENTS

| | | |
|---|---|---|
| CA | 3093656 A | 10/2019 |
| CN | 1426143 A | 6/2003 |
| CN | 103820848 B | 9/2016 |
| CN | 109929558 * | 6/2019 |
| CN | 109929558 A | 6/2019 |
| EP | 3511395 A1 | 7/2019 |
| KR | 20140121217 A | 10/2014 |
| KR | 1020170022951 A | 3/2017 |
| KR | 1020170034055 A | 3/2017 |
| KR | 1730401 B1 | 4/2017 |
| KR | 1020170048220 A | 5/2017 |
| KR | 1020180043748 A | 4/2018 |
| KR | 1020180058208 A | 5/2018 |
| KR | 1020180081002 A | 7/2018 |
| KR | 1020180096535 A | 8/2018 |
| KR | 1020190019863 A | 2/2019 |
| KR | 1020190073301 A | 6/2019 |

(Continued)

OTHER PUBLICATIONS

Extended European Search Report dated Jul. 13, 2021, of the corresponding European Patent Application No. 21162328.5.
K. David Wegner et al., "Gallium—a versatile element for tuning the photoluminescence properties of InP quantum dots," ChemComm, Communication, Jan. 11, 2019, pp. 1-4.
W.-M. Schulz et al., "Optical and structural properties of InP quantum dots embedded in (AlxGa1-x)0.51In0.49P," Physical Review B, 2009, pp. 1-8 (035329), vol. 79.

(Continued)

*Primary Examiner* — C Melissa Koslow

(74) *Attorney, Agent, or Firm* — Cantor Colburn LLP

(57) ABSTRACT

A quantum dot, a production method thereof, and a quantum dot composite and a device including the same are disclosed, wherein the quantum dot includes an alloy semiconductor nanocrystal including indium (In), gallium, zinc (Zn), phosphorus (P), and sulfur (S), and in the quantum dot, a mole ratio of gallium with respect to indium (Ga:In) is greater than or equal to about 0.2:1, a mole ratio of phosphorus with respect to indium (P:In) is greater than or equal to about 0.95:1, the quantum dot does not include cadmium, and in an UV-Vis absorption spectrum of the quantum dot(s), a first absorption peak is present in a range of less than or equal to about 520 nm.

28 Claims, 6 Drawing Sheets

(56) References Cited

FOREIGN PATENT DOCUMENTS

| KR | 1020190085885 A | 7/2019 |
| KR | 1020200006941 A | 1/2020 |
| KR | 1020200016057 A | 2/2020 |
| KR | 1020210001788 A | 1/2021 |

OTHER PUBLICATIONS

Joong Pill Park et al., "Highly luminescent InP/GaP/ZnS QDs emitting in the entire color range via a heating up process," nature, scientific reports, Jul. 20, 2016, pp. 1-6, vol. 6:30094.
Vishwas Srivastava et al., "Colloidal Chemistry in Molten Salts: Synthesis of Luminescent In1-xGaxP and In1-xGaxAs Quantum Dots," Journal of the American Chemical Society, Aug. 20, 2018, pp. 12144-12151, vol. 140.

\* cited by examiner

Pattern Preparation by using a photoresist

Repeating the Patterning Process three times

QUANTUM DOTS, AND COMPOSITE AND DISPLAY DEVICE INCLUDING THE SAME

CROSS-REFERENCE TO RELATED APPLICATION

This application claims priority to and the benefit of Korean Patent Application No. 10-2020-0031617 filed in the Korean Intellectual Property Office on Mar. 13, 2020, and all the benefits accruing therefrom under 35 U.S.C. § 119, the entire content of which in its entirety is herein incorporated by reference.

BACKGROUND

1. Field

A quantum dot and a composite and a display device including the same are disclosed.

2. Description of the Related Art

A quantum dot ("QD") is a nanocrystal of semiconductor material with a diameter of about several nanometers to several tens of nanometers (i.e., a nano-sized semiconductor nanocrystal), which exhibits a quantum confinement effect. Quantum dots may have different bandgap energies by controlling sizes and compositions of nanocrystals, unlike bulk materials. Quantum dots may exhibit electroluminescence and photoluminescence properties. In a chemical wet process, organic materials such as dispersing agents are coordinated on, e.g., to, the surface of the semiconductor nanocrystal during a crystal growth to provide quantum dots having controlled sizes and photoluminescence characteristics. Light emitting properties of quantum dots may be applied, e.g., used, in various fields. From an environmental point of view, it is desirable to develop quantum dots that can realize, e.g., provide, improved light emitting properties and are free of noxious heavy metals such as cadmium or lead, and the like.

SUMMARY

An embodiment is related to a quantum dot capable of exhibiting improved light emitting properties (e.g., excitation light absorption) and emitting light of a desired wavelength.

An embodiment is related to a method of producing the quantum dot(s).

An embodiment is related to a composition including the quantum dot(s).

An embodiment is related to a quantum dot polymer composite including the quantum dot(s).

An embodiment is related to a stacked structure and a display device that include the quantum dot-polymer composite.

An embodiment is related to an electronic device including the quantum dot(s).

In an embodiment, a quantum dot (or quantum dots) includes (include) an alloy semiconductor nanocrystal (that may be a core) including indium (In), gallium, zinc (Zn), phosphorus (P), and sulfur (S), and in the quantum dot(s), a mole ratio of gallium with respect to indium (Ga:In) is greater than or equal to about 0.2:1, a mole ratio of phosphorus with respect to indium (P:In) is greater than or equal to about 0.95:1, the quantum dot(s) does (do) not include cadmium, and in an ultraviolet-visible (UV-Vis) absorption spectrum of the quantum dot(s), a first absorption peak is present in a range of less than or equal to about 520 nanometers (nm).

The first absorption peak may be present in a range of greater than or equal to about 400 nm.

The alloy semiconductor nanocrystal may be a homogenous alloy.

In the quantum dot(s), a mole ratio of gallium with respect to indium (Ga:In) may be greater than or equal to about 0.35:1.

In the quantum dot(s), a mole ratio of gallium with respect to indium (Ga:In) may be less than or equal to about 1:1, or less than or equal to about 0.85:1.

In the quantum dot(s), a mole ratio of phosphorus with respect to indium (P:In) may be greater than or equal to about 1:1, or greater than or equal to about 1.2:1.

In the quantum dot(s), a mole ratio of phosphorus with respect to indium (P:In) may be less than or equal to about 3.0:1.

In the quantum dot(s), a mole ratio of a sum of indium and gallium with respect to phosphorus (In+Ga):P may be greater than or equal to about 0.8:1, or greater than or equal to about 0.9:1.

In the quantum dot(s), a mole ratio of a sum of indium and gallium with respect to phosphorus (In+Ga)/P may be less than or equal to about 1.3:1.

In an embodiment, a wavelength of a first absorption peak in an UV-Vis absorption spectrum of the quantum dot(s) or the alloy semiconductor nanocrystal(s) thereof may be in a range of greater than or equal to about 400 nm, greater than or equal to about 410 nm, greater than or equal to about 420 nm, or greater than or equal to about 430 nm. The wavelength of the first absorption peak may be in a range of less than or equal to about 450 nm, less than or equal to about 445 nm, less than or equal to about 440 nm, less than or equal to about 435 nm, or less than or equal to about 430 nm.

In an embodiment, a wavelength of a first absorption peak in an UV-Vis absorption spectrum of the quantum dot(s) may be in a range of greater than or equal to about 485 nm, greater than or equal to about 490 nm, or greater than or equal to about 495 nm. The wavelength of the first absorption peak may be in a range of less than or equal to about 515 nm, less than or equal to about 510 nm, less than or equal to about 505 nm, or less than or equal to about 500 nm.

In the quantum dot(s) or the alloy semiconductor nanocrystal (that may be in the form of a core), a mole ratio of zinc with respect to indium (Zn:In) may be greater than or equal to about 0.5:1, or greater than or equal to about 0.9:1. In the quantum dot(s) (or the alloy semiconductor nanocrystal core), a mole ratio of zinc with respect to indium (Zn:In) may be less than or equal to about 3:1.

In the quantum dot(s) or the alloy semiconductor nanocrystal (that may be in the form of a core), a mole ratio of a sum of indium, gallium, and zinc with respect to a sum of sulfur and phosphorus ((In+Ga+Zn):(P+S)) may be greater than or equal to about 1:1 and/or less than or equal to about 1.8:1.

In the quantum dot(s) or the alloy semiconductor nanocrystal (that may be in the form of a core), a mole ratio of sulfur with respect to indium (S:In) may be greater than or equal to about 0.3:1, greater than or equal to about 0.5:1, greater than or equal to about 0.7:1, or greater than or equal to about 1:1. In the quantum dot(s) or the alloy semiconductor nanocrystal (that may be in the form of a core), a mole ratio of sulfur with respect to indium (S:In) may be less than or equal to about 1.5:1, less than or equal to about 1:1, or less than or equal to about 0.9:1.

The quantum dot(s) may further include a semiconductor nanocrystal shell disposed on a core including the alloy semiconductor nanocrystal, the semiconductor nanocrystal shell including zinc, sulfur, and selenium.

In the quantum dot(s) or the alloy semiconductor nanocrystal core of an embodiment, a mole ratio of zinc with respect to a sum of indium and gallium Zn:(In+Ga) may be greater than or equal to about 1:1, greater than or equal to about 5:1, greater than or equal to about 10:1, greater than or equal to about 15:1, or greater than or equal to about 20:1. In the quantum dot(s) or the alloy semiconductor nanocrystal core of an embodiment, a mole ratio of zinc with respect to a sum of indium and gallium Zn:(In+Ga) may be less than or equal to about 70:1, less than or equal to about 65:1, less than or equal to about 60:1, less than or equal to about 55:1, less than or equal to about 50:1, less than or equal to about 45:1, less than or equal to about 40:1, less than or equal to about 35:1, or less than or equal to about 30:1.

In an embodiment, the semiconductor nanocrystal shell may include a first layer including a first semiconductor nanocrystal including zinc and selenium, and a second layer disposed on the first layer, the second layer including a second semiconductor nanocrystal including zinc and sulfur.

In the quantum dot(s) of an embodiment, a mole ratio of sulfur with respect to selenium (S:Se) may be less than or equal to about 2.5:1, for example, less than or equal to about 2:1, less than or equal to about 1.8:1, less than or equal to about 1.6:1, less than or equal to about 1.4:1, less than or equal to about 1.2:1, less than or equal to about 1:1, less than or equal to about 0.9:1, less than or equal to about 0.8:1, or less than or equal to about 0.7:1. In the quantum dot(s) of an embodiment, a mole ratio of sulfur with respect to selenium (S:Se) may be greater than or equal to about 0.1:1, greater than or equal to about 0.2:1, greater than or equal to about 0.3:1, greater than or equal to about 0.4:1, or greater than or equal to about 0.5:1.

In an embodiment, a thickness of the first layer may be greater than or equal to about 3 monolayers. The thickness of the first layer may be greater than or equal to about 0.9 nm. The thickness of the first layer may be less than or equal to about 1.4 nm.

In an embodiment, a thickness of the second layer may be less than or equal to about 0.7 nm, for example, less than or equal to about 0.6 nm. The thickness of the second layer may be greater than or equal to about 0.3 nm.

The first layer may not include sulfur. The first layer may be disposed directly on a surface of the core. The second layer may be an outermost layer of the quantum dot. The second layer may be disposed directly on a surface of the first layer.

A size of the alloy semiconductor nanocrystal or core may be greater than or equal to about 2 nm, greater than or equal to about 2.2 nm, greater than or equal to about 2.3 nm, greater than or equal to about 2.4 nm, greater than or equal to about 2.5 nm, or greater than or equal to about 2.6 nm. A size of the alloy semiconductor nanocrystal or core may be less than or equal to about 4 nm, less than or equal to about 3.9 nm, less than or equal to about 3.8 nm, less than or equal to about 3.7 nm, less than or equal to about 3.6 nm, less than or equal to about 3.5 nm, less than or equal to about 3.4 nm, less than or equal to about 3.3 nm, or less than or equal to about 3.2 nm.

A size (or an average size) of the quantum dot(s) may be greater than or equal to about 4 nm, greater than or equal to about 4.5 nm, greater than or equal to about 5 nm, greater than or equal to about 5.5 nm, greater than or equal to about 6 nm, or greater than or equal to about 6.5 nm. A size (or an average size) of the quantum dot(s) may be less than or equal to about 10 nm, less than or equal to about 9 nm, less than or equal to about 8 nm, less than or equal to about 7 nm, or less than or equal to about 6 nm.

A quantum efficiency (or quantum yield) of the quantum dot may be greater than or equal to about 65%, greater than or equal to about 70%, or greater than or equal to about 75%.

In an embodiment, a method of producing the aforementioned quantum dot(s) includes:
activating (e.g., heating for example under vacuum) a mixture including an indium precursor, a zinc precursor, and a sulfur precursor, and optionally an organic ligand in an organic solvent to provide an activated (heated) mixture;
adding a gallium precursor and a phosphorus precursor to the activated (heated) mixture; and
carrying out a reaction at a reaction temperature to synthesize the alloy semiconductor nanocrystal or core and produce the quantum dot, wherein the gallium precursor does not include an oxygen containing moiety or a halogen containing moiety.

The synthesis of the alloy semiconductor nanocrystal or core may be carried out in the presence of an organic acid.

The indium precursor may include a C10 to C40 carboxylate moiety. The zinc precursor may include a C10 to C40 carboxylate moiety. The sulfur precursor may include a C1 to C40 alkyl thiol compound. The gallium precursor may be a compound including a C1 to C30 hydrocarbon group.

The method may further include reacting a zinc precursor with a chalcogen precursor (e.g., a sulfur precursor, a selenium precursor, or a combination thereof) in the presence of the alloy semiconductor nanocrystal in an organic solvent to form the semiconductor nanocrystal shell on the alloy semiconductor nanocrystal in the form of a core.

In an embodiment, a composition may include (e.g., a plurality of) the aforementioned quantum dot(s); optionally a dispersing agent; and optionally a (organic) solvent (or a liquid vehicle). The dispersing agent may include a carboxylic acid group containing compound (e.g., a binder polymer or a monomer thereof). The composition may further include a (photo)polymerizable monomer including a carbon-carbon double bond and optionally (thermal or photo) initiators.

In an embodiment, a quantum dot composite (e.g., a quantum dot polymer composite) includes a matrix (e.g., a polymer matrix) and (e.g., a plurality of) the aforementioned quantum dot(s) dispersed in the (polymer) matrix.

The (polymer) matrix may be a linear polymer, a crosslinked polymer, or a combination thereof.

The crosslinked polymer may include a thiolene polymer, a crosslinked poly(meth)acrylate, a crosslinked polyurethane, a crosslinked epoxy resin, a crosslinked vinyl polymer, a crosslinked silicone resin, or a combination thereof.

The linear polymer may include a repeating unit having a carboxylic acid.

The linear polymer may include a unit derived from a monomer including a carbon-carbon double bond and a carboxylic acid group, a unit derived from a monomer having a dianhydride moiety, or a combination thereof.

The linear polymer may include:
a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH); or a combination thereof.

The quantum dot (polymer) composite may further include a metal oxide particulate (e.g., dispersed in the matrix), or a combination thereof.

The quantum dot (polymer) composite may have a form of a patterned film.

The quantum dot (polymer) composite may have an absorption of greater than or equal to about 90% for blue light (e.g., having a wavelength in the range of about 450 nm to about 470 nm).

In an embodiment, the quantum dot (polymer) composite may have a photoconversion rate of greater than or equal to about 15%, for example, greater than or equal to about 25% (for example, even when the quantum dot (polymer) composite is subjected to a thermal treatment at about 180° C. for 30 minutes).

In an embodiment, a display device includes a photoluminescence element and optionally a light source, wherein the photoluminescence element includes the aforementioned quantum dot composite, and the light source is configured to provide the photoluminescence element with incident light.

The incident light may include a light of a peak wavelength of about 440 nm to about 460 nm, or about 450 nm to about 455 nm.

The photoluminescence element may include a sheet of the quantum dot polymer composite.

The photoluminescence element may be a stacked structure including a substrate and a light emitting layer disposed on the substrate, wherein the light emitting layer includes a quantum dot composite pattern.

The pattern may include a, e.g., at least one, repeating section to emit light at a predetermined wavelength.

The repeating section may include a first section that emits first light (e.g., red light).

The repeating section may include a second (repeating) section that emits second light (e.g., green light) having a different wavelength from the first light.

The repeating section may include a first section emitting red light and a second section emitting green light.

The pattern may include a first (repeating) section emitting first light and a second section emitting second light having a luminescent peak wavelength that is different from that of the first light.

In an embodiment, a luminescent device includes:
a first electrode and a second electrode facing each other; and
an emissive layer disposed between the first electrode and the second electrode and including a plurality of quantum dots, wherein the plurality of quantum dots include the aforementioned quantum dot(s).

In an embodiment, a quantum dot includes an alloy semiconductor nanocrystal core including indium, gallium, zinc, phosphorus, and sulfur; and a semiconductor nanocrystal shell disposed on the alloy semiconductor nanocrystal core, wherein the quantum dot does not include cadmium, and wherein in the quantum dot, a mole ratio of gallium with respect to indium is about 0.35:1 to about 1:1, a mole ratio of phosphorus with respect to indium is greater than or equal to about 1:1, and a mole ratio of a sum of indium and gallium with respect to phosphorus is about 0.8:1 to about 1.3:1.

The quantum dot(s) according to an embodiment includes an InGaZnPS alloy semiconductor nanocrystal and thus an individual quantum dot particle(s) may exhibit improved luminescence efficiency together with enhanced light absorbance, and when being applied in a device (e.g., a photoconversion layer), the quantum dot(s) of an embodiment may suppress excitation light leakage phenomenon and have improved photoconversion rate.

In an embodiment, the quantum dots that can show, e.g., exhibit, improved blue light absorption may have a potential utility in a photoluminescent, quantum dot based color filter. The quantum dots or the photoluminescent color filter including the same may utilize various blue light source (e.g., blue light organic light emitting diodes (OLEDs), blue light emitting micro light emitting diodes (LEDs), liquid crystal display devices including blue light sources, and the like. The photoluminescent color filter may be used in a television (TV), a monitor, a mobile device, a virtual reality/augmented reality (VR/AR) device, a display for an automotive application component, or the like. The quantum dot of an embodiment may be used in various display devices and biological labeling (e.g., biosensors or bio-imaging), photodetectors, solar cells, hybrid composites, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
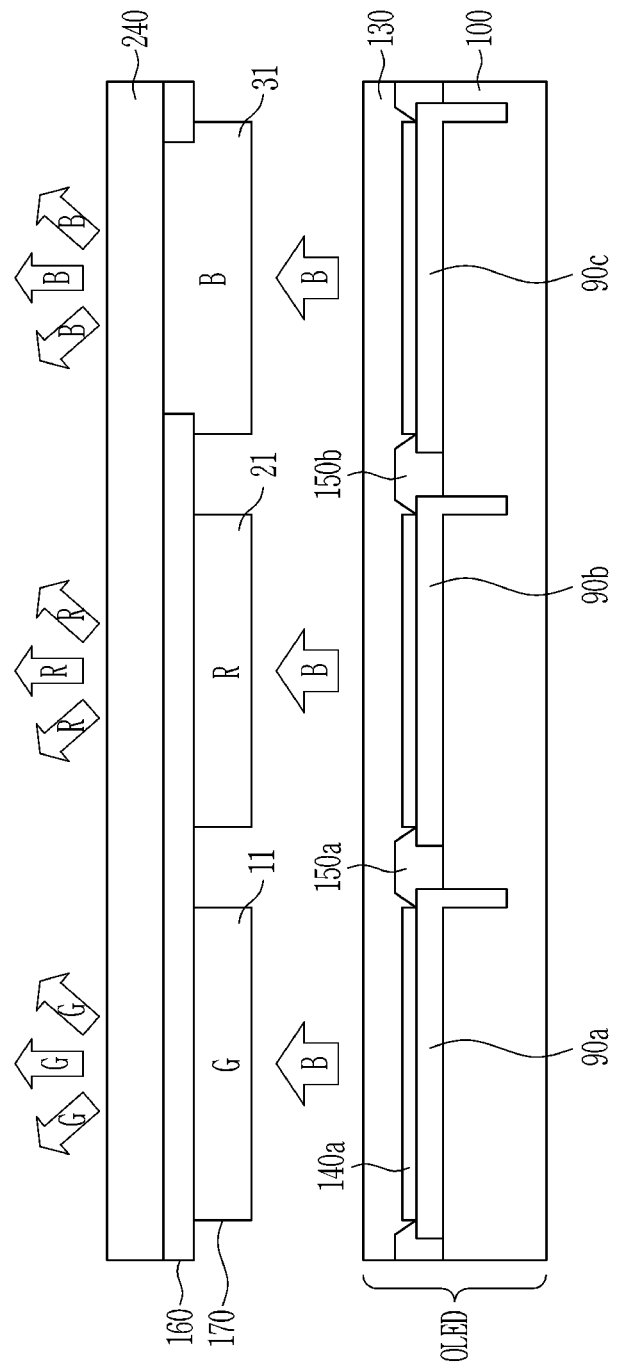
FIG. 1 is a schematic view showing a cross-section of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, the term "quantum dot" may refer to an individual quantum dot and may refer to a plurality of quantum dots (e.g., a population of quantum dots).

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" and "upper" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amino or amine group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the prefix "hetero" may refer to inclusion of one to three heteroatoms such as N, O, S, Si, or P.

As used herein, when a definition is not otherwise provided, a hydrocarbon (group) refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" refers to a group formed by removal of at least one hydrogen from an aromatic hydrocarbon (e.g., a phenyl or naphthyl group).

As used herein, when a definition is not otherwise provided, "(meth)acrylate" refers to acrylate, methacrylate, or a combination thereof.

As used herein, when a definition is not otherwise provided, a "thiol compound" refers to a compound having a, e.g., at least one, thiol group.

As used herein, the term "light conversion efficiency" refers to a percentage of a light emission (A) of a quantum dot composite with respect to excitation light (e.g., blue light) (B). As used herein, a "light absorption" refers to a percentage of an amount of light absorbed by a quantum dot composite with respect to an amount of incident light (e.g., blue light). The total amount of excitation light (B) is obtained by integration of a luminescence spectrum of the incident light, an amount (B') of incident light passing through the quantum dot-polymer composite film is obtained, and the light conversion efficiency and the light absorption are obtained by the following equations:

$$(A/B) \times 100\% = \text{light conversion rate (\%)}$$

$$((B-B')/B) \times 100\% = \text{blue light absorption (\%) of a film.}$$

As used herein, the term "Group" refers to a group of Periodic Table.

As used herein, "Group III" refers to Group IIIA and Group IIIB, and examples of Group III metal may be Al, In, Ga, and TI, but are not limited thereto.

As used herein, "Group V" may refer to Group VA, and examples thereof may include nitrogen, phosphorus, arsenic, antimony, and bismuth, but are not limited thereto.

The term "average" used in this specification (e.g., an average size of the quantum dot) may be mean or median. In an embodiment, the average may be "mean" average.

The quantum efficiency of the quantum dot may be a quantum yield that can be readily and reproducibly measured by any commercially available equipment, for example, from Hitachi Co. Ltd or Hamamatsu Co. Ltd and referring to the instruction manuals provided from the manufacturer. In an embodiment, the quantum efficiency (or quantum yield) may be measured in a solution state or a solid state (in a composite). In an embodiment, "quantum yield (or quantum efficiency)" may be a percentage of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths, but are not limited thereto.

The full width at half maximum (FWHM) and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or a harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

As used herein, "first absorption peak wavelength" refers to a wavelength of the first main peak appearing in the lowest energy region in an ultraviolet-visible absorption spectrum.

A quantum dot is a crystalline semiconductor material (e.g., semiconductor nanocrystal particle) having a nanoscale size. The quantum dot has a large surface area per a unit volume due to the very small particle size, and thus, exhibits a quantum confinement effect and different properties than those of a bulk material having the same elemental composition. The quantum dot may absorb light from an excitation source and then emit energy (e.g., light) corresponding to a bandgap energy of the quantum dot. The quantum dots have potential applicability in various devices (e.g., an electronic device).

Cadmium-based quantum dots may exhibit optical properties applicable to electronic devices such as for displays. However, cadmium raises serious environment/health problems and concerns, and is one of restricted elements in many countries. As a type of cadmium free quantum dot, there is a Group III—V-based nanocrystal. However, stability (e.g., chemical or thermal stability) of cadmium free quantum dots may be inferior to the stability of cadmium based quantum dots. When the cadmium free quantum dots undergo various processes in order to be applied to an electronic device, the cadmium free quantum dots may exhibit sharply decreased luminous properties in comparison with initial properties of the cadmium free quantum dots. In addition, a low level of blue light absorption of the cadmium free quantum dots may cause a blue light leakage phenomenon.

When the quantum dot is used in a patterned film such as a color filter, the decrease in the excitation light absorption of the quantum dot may be a direct cause of a blue light leakage in a display device, which may adversely affect a color gamut (e.g., a coverage rate under a Digital Cinema Initiative (DCI) standard) of the device and may also result in a decrease of a luminous efficiency.

As a measure addressing a decreased absorption of the excitation light, a dye (e.g., a yellow dye) based blue light absorption layer may be disposed between the quantum dot color filter and a substrate. However, the insertion of the blue light absorption layer may result in a decrease of a utilization rate of blue light. In addition, despite the insertion of the blue light absorption layer, a light having a wavelength of less than or equal to about 500 nm may leak from a green light pixel, which may in turn have an adverse effect on a color purity of the device. Accordingly, it is desired to develop a quantum dot having an enhanced absorption for excitation light together with a luminous efficiency of a desired level. It may be difficult for quantum dots including an InP-based core and a Zn chalcogenide shell to provide desired luminous efficiency and desired absorption, simultaneously. Indium phosphide-based quantum dots may exhibit a relatively low absorption of light having a wavelength of about 450 nm, compared with quantum dots having a different (e.g., cadmium compound or lead compound-based) composition, thus improvement for this drawback may be desired.

The present inventors have found that an indium phosphide core alloyed with gallium may address the aforementioned problems. However, it may not be easy to realize (or produce) a gallium alloyed, indium phosphide semiconductor nanocrystal as a colloidal nanocrystal particle. Without wishing to be bound by any theory, it is believed that available precursors may not possess sufficient reactivity for producing an InP nanocrystal particle alloyed with gallium (in particular to have a desired amount of gallium). The present inventors have found that a reaction between an indium precursor and a phosphorous precursor may proceed readily and quickly, but a gallium precursor such as gallium acetylacetonate, gallium oleate, or the like may hardly participate in a reaction with an indium precursor, a phosphorous precursor, or a combination thereof due to the high affinity of the gallium for oxygen even when the gallium is reported to have an appropriate reactivity.

Gallium may be introduced into an indium phosphide semiconductor nanocrystal using a cation exchange technique. However, the exchange may occur mainly from a surface of the semiconductor nanocrystal to form a layer of a gallium phosphide (GaP), and thus it may be difficult to obtain an alloy semiconductor nanocrystal particle wherein the gallium is relatively uniformly distributed.

A molten salt of a temperature of greater than or equal to about 380° C. may be used for exchanging of gallium in an indium phosphide nanocrystal. However, use of a molten salt of a temperature of greater than or equal to about 380° C. for exchanging of gallium in an indium phosphide nanocrystal involves a total removal of a native ligand present on a surface of a colloidally synthesized quantum dot, an exchange with a short inorganic $S^{2-}$ligand, and a reaction in a hot inorganic salt at a temperature of greater than or equal to about 380° C. Therefore, it may not be desirable to use a molten salt of a temperature of greater than or equal to about 380° C. for exchanging of gallium in an indium phosphide nanocrystal. In addition, the bare surface of the quantum dot may have to be exposed to a polar solvent of a high boiling point (e.g., formamide), which may cause a surface oxidation of a quantum dot and make it difficult to subsequently control a shell interface, and a quantum dot having a quantum efficiency of a limited level (e.g., less than or equal to about 44%) may be provided.

The present inventors have found that by adopting the method disclosed herein, an alloy semiconductor nanocrystal including indium gallium phosphide with a desired composition may be prepared and a quantum dot including the alloy semiconductor nanocrystal may exhibit improved luminous properties together with enhanced excitation light absorption.

Therefore, in an embodiment, a quantum dot may have a structure, a composition, or a combination thereof that will be described in detail herein and without being based on cadmium, a quantum dot of an embodiment may show, e.g., exhibit, improved optical properties (e.g., improved 450 nm/350 nm absorption ratio) and a composite including the same may exhibit improved blue light absorption while emitting light of a desired wavelength (e.g., green light).

In an embodiment, the quantum dot does not include cadmium. In an embodiment, the quantum dot may not include a harmful heavy metal such as lead, mercury, or the like. According to an embodiment, a quantum dot includes an alloy semiconductor nanocrystal including indium (In), gallium, zinc (Zn), phosphorus (P), and sulfur (S). In the quantum dot or the alloy semiconductor nanocrystal, a mole ratio of gallium with respect to indium (Ga:In) is greater than or equal to about 0.2:1, and a mole ratio of phosphorus with respect to indium (P:In) is greater than or equal to about 0.95:1. In an UV-Vis absorption spectrum of the quantum dot(s), a first absorption peak is present in a range of less than or equal to about 520 nm. The first absorption peak may be present in a range of greater than or equal to about 400 nm. In an embodiment, the quantum dot may have a core-shell structure that will be described herein and the alloy semiconductor nanocrystal may be included in the core.

The alloy semiconductor nanocrystal may be a homogeneous alloy. The alloy semiconductor nanocrystal may include gallium present not only on a surface portion thereof but also an inner portion thereof (e.g., distributed relatively uniformly). The alloy semiconductor nanocrystal may have a structure wherein zinc sulfide and gallium phosphide are alloyed (e.g., homogeneously) in a crystal structure (e.g., having a zinc blende crystalline structure) of indium phosphide. The alloy semiconductor nanocrystal may have a zinc blende crystal structure that may be found in an indium phosphide crystal or an alloy thereof. The alloy composition of the quantum dot of an embodiment may contribute an improvement of an absorption of excitation light (e.g., blue light).

The present inventors have found that an indium phosphide core alloyed with gallium phosphide may have widened bandgap and an effective mass approximation (EMA) confirms that the indium phosphide core alloyed with gallium phosphide may show, e.g., exhibit, an increased volume for emitting light of a desired wavelength (e.g., green light). In an embodiment, the EMA is carried out for a quantum dot having a structure of an InGaP core/ZnSe shell/ZnS shell under an assumption of an emission wavelength of about 540 nm, as a mole fraction (x) of gallium increases, a 2nd absorption peak is shifted toward a 1st absorption peak, which may improve absorbance of blue light having a wavelength of about 450 nm.

A volume increase of the core may result in an increase in a number of electrons involving absorbance, and thus an absorption coefficient for an individual particle including the core may also increase. Without wishing to be bound by any theory, it is believed that as the core in a core shell structure may serve as a gathering place for excitons, a small increase in the core volume may bring forth, e.g., result in, a sharp increase in the absorption coefficient. In addition, unlike an increase of the shell thickness, a weight increase caused by a size increase may be kept a relatively limited level.

The present inventors have also found that the gallium alloyed, indium phosphide core may have an increased number of states for light absorption in a quantum dot, and when being combined with a predetermined composition that will be described in detail herein, the gallium alloyed, indium phosphide core may contribute an increased absorption per a unit weight of a population of quantum dots. In other words, the present inventors have found that in case of the alloyed semiconductor nanocrystal of an embodiment, a change in a quantum dot density number and a change in a UV-Vis absorption spectrum are considered together and in the InGaP alloy core, an increase in the gallium fraction may bring forth, e.g., result in, both of an absorption increase effect of an individual quantum dot and a decrease in the quantum dot density number, but the increase of the absorption increase effect outweigh the decrease in the quantum dot density number. Thus, a quantum dot (polymer) composite including the quantum dots of an embodiment or a color filter including the same may exhibit increased absorbance in comparison with a quantum dot having an InP core without gallium and the same shell composition.

Therefore, in the quantum dot or the alloy semiconductor nanocrystal (hereinafter, referred to as "quantum dot" and thus, unless mentioned otherwise to the contrary in this specification, the description about "quantum dot" may also applied to the alloy semiconductor nanocrystal) of an embodiment, a mole ratio of gallium with respect to indium (Ga:In) may be greater than or equal to about 0.25:1, greater than or equal to about 0.3:1, greater than or equal to about 0.35:1, greater than or equal to about 0.4:1, greater than or equal to about 0.45:1, or greater than or equal to about 0.5:1. In the quantum dot (or the alloy semiconductor nanocrystal) a mole ratio of gallium with respect to indium (Ga:In) may be less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.55:1, or less than or equal to about 0.5:1.

In the quantum dot of an embodiment, a mole ratio of phosphorus with respect to indium (P:In) may be greater than or equal to about 1:1, greater than or equal to about 1.05:1, greater than or equal to about 1.1:1, greater than or equal to about 1.2:1, greater than or equal to about 1.3:1, greater than or equal to about 1.35:1, or greater than or equal to about 1.4:1. In the quantum dot of an embodiment, a mole ratio of phosphorus with respect to indium (P:In) may be less than or equal to about 3.0:1, less than or equal to about 2.7:1, less than or equal to about 2.5:1, less than or equal to about 2.3:1, less than or equal to about 2:1, less than or equal to about 1.8:1, less than or equal to about 1.6:1, less than or equal to about 1.5:1, less than or equal to about 1.48:1, less than or equal to about 1.46:1, or less than or equal to about 1.45:1.

In the quantum dot of an embodiment, a mole ratio of a sum of indium and gallium with respect to phosphorus (In+Ga):P may be greater than or equal to about 0.8:1, greater than or equal to about 0.85:1, greater than or equal to about 0.9:1, greater than or equal to about 0.92:1, greater than or equal to about 0.95:1, greater than or equal to about 1:1, greater than or equal to about 1.05:1, or greater than or equal to about 1.1:1. In the quantum dot of an embodiment, a mole ratio of a sum of indium and gallium with respect to phosphorus (In+Ga):P may be less than or equal to about 1.3:1, less than or equal to about 1.25:1, less than or equal to about 1.2:1, less than or equal to about 1.15:1, or less than or equal to about 1.1:1.

In an embodiment, a wavelength of a first absorption peak in an UV-Vis absorption spectrum of the quantum dot(s) or the alloy semiconductor nanocrystal(s) thereof may be in a range of greater than or equal to about 400 nm, greater than or equal to about 410 nm, greater than or equal to about 420 nm, or greater than or equal to about 430 nm. The wavelength of a first absorption peak of the quantum dot(s) or the alloy semiconductor nanocrystal(s) thereof may be in a range of less than or equal to about 450 nm, less than or equal to about 445 nm, less than or equal to about 440 nm, less than or equal to about 435 nm, or less than or equal to about 430 nm. In an embodiment (for example, in case of having the core shell structure described herein), the wavelength of a first absorption peak of the quantum dot(s) may be in a range of greater than or equal to about 485 nm, greater than or equal to about 490 nm, or greater than or equal to about 495 nm. The wavelength of a first absorption peak of the quantum dot(s) may be in a range of less than or equal to about 515 nm, less than or equal to about 510 nm, less than or equal to about 505 nm, or less than or equal to about 500 nm.

In an embodiment, the quantum dots may emit green light. A maximum luminescent peak wavelength of the green light may be greater than or equal to about 500 nm, for example, greater than or equal to about 510 nm, greater than or equal to about 515 nm, greater than or equal to about 520 nm, greater than or equal to about 525 nm, greater than or equal to about 530 nm, greater than or equal to about 535 nm, or greater than or equal to about 540 nm and less than or equal to about 560 nm, for example, less than or equal to about 550 nm, less than or equal to about 545 nm, or less than or equal to about 540 nm.

In the quantum dot(s) or the alloy semiconductor nanocrystal(s), a mole ratio of zinc with respect to indium (Zn:In) may be greater than or equal to about 0.5:1, greater than or equal to about 0.7:1, greater than or equal to about 0.9:1, greater than or equal to about 1:1, greater than or equal to about 1.1:1, greater than or equal to about 1.3:1, greater than or equal to about 1.5:1, greater than or equal to about 1.7:1, or greater than or equal to about 1.9:1. In the quantum dot(s) or the alloy semiconductor nanocrystal(s), a mole ratio of zinc with respect to indium (Zn:In) may be less than or equal to about 3:1, less than or equal to about 2.8:1, less than or equal to about 2.6:1, less than or equal to about 2.4:1, less than or equal to about 2.2:1, or less than or equal to about 2:1. In the quantum dot(s) or the alloy semiconductor nanocrystal(s), a mole ratio of zinc with respect to a sum of indium and gallium Zn:(In+Ga) may be greater than or equal to about 1:1, greater than or equal to about 1.2:1, or greater than or equal to about 1.3:1. In the quantum dot(s) or the alloy semiconductor nanocrystal(s), a mole ratio of zinc with respect to a sum of indium and gallium Zn:(In+Ga) may be less than or equal to about 3:1, less than or equal to about 2:1, or less than or equal to about 1.5:1.

In the quantum dot(s) or the alloy semiconductor nanocrystal core, a mole ratio of a sum of indium, gallium, and zinc with respect to a sum of sulfur and phosphorus ((In+Ga+Zn):(P+S)) may be greater than or equal to about 1:1, greater than or equal to about 1.3:1, greater than or equal to about 1.5:1, or greater than or equal to about 1.6:1, greater than or equal to about 1.7:1 and less than or equal to about 1.8:1, or less than or equal to about 1.75:1.

In the quantum dot(s) or the alloy semiconductor nanocrystal core, a mole ratio of sulfur with respect to indium (S:In) may be greater than or equal to about 0.3:1, greater than or equal to about 0.5:1, greater than or equal to about 1:1, greater than or equal to about 1.5:1, greater than or equal to about 2:1, greater than or equal to about 5:1, greater than or equal to about 10:1, or greater than or equal to about 15:1. In the quantum dot(s) or the alloy semiconductor nanocrystal core, a mole ratio of sulfur with respect to indium (S:In) may be less than or equal to about 30:1, less than or equal to about 29:1, less than or equal to about 28:1, less than or equal to about 27:1, less than or equal to about 26:1, less than or equal to about 25:1, less than or equal to about 24:1, less than or equal to about 23:1, less than or equal to about 22:1, less than or equal to about 21:1, less than or equal to about 20:1, or less than or equal to about 19:1.

The quantum dot(s) may further include a semiconductor nanocrystal shell disposed on the alloy semiconductor nanocrystal core. The semiconductor nanocrystal shell may include zinc, sulfur, and selenium. The alloy semiconductor nanocrystal shell may be included in the core of the core shell structure of the quantum dot(s).

A size (or an average size) of the core (or the alloy semiconductor nanocrystal, hereinafter may be referred to as "core") may be greater than or equal to about 2 nm, greater than or equal to about 2.2 nm, greater than or equal to about 2.3 nm, greater than or equal to about 2.4 nm, greater than or equal to about 2.5 nm, or greater than or equal to about 2.6 nm. A size (or an average size) of the core may be less than or equal to about 4 nm, less than or equal to about 3.9 nm, less than or equal to about 3.8 nm, less than or equal to about 3.7 nm, less than or equal to about 3.6 nm, less than or equal to about 3.5 nm, less than or equal to about 3.4 nm, less than or equal to about 3.3 nm, or less than or equal to about 3.2 nm. As used herein, a dimension such as a size (e.g., a quantum dot-related dimension) may refer to an average (mean or median average) value thereof (e.g., an average size). The size of the quantum dots may be a particle diameter. The size of the quantum dots may have a diameter or an equivalent diameter calculated by converting a two-dimensional area identified by transmission electron microscopy.

In an embodiment, the quantum dot may have a core-shell structure (e.g., a core-multishell structure). In an embodiment, a semiconductor nanocrystal shell may include a first layer including a first semiconductor nanocrystal including zinc and selenium, and a second layer disposed on the first layer and including a second semiconductor nanocrystal including zinc and sulfur. The first layer may include ZnSe. The first layer may or may not include sulfur. For example, the first layer may or may not include ZnSeS. The first layer may consist of ZnSe. The first layer may be disposed directly on the alloy semiconductor nanocrystal core.

In an embodiment, a thickness of the first layer may be greater than or equal to about 3 monolayers (ML), for example, greater than or equal to about 3.5 ML, greater than or equal to about 3.6 ML, greater than or equal to about 3.7 ML, greater than or equal to about 3.8 ML, greater than or equal to about 3.9 ML, or greater than or equal to about 4 ML. The thickness of the first layer may be less than or equal to about 7 ML, for example, less than or equal to about 6 ML, or less than or equal to about 5 ML.

In an embodiment, the thickness of the first layer may be greater than or equal to about 0.9 nm, greater than or equal to about 1 nm, greater than or equal to about 1.1, or greater than or equal to about 1.2 nm and less than or equal to about 1.4 nm, less than or equal to about 1.3 nm, or less than or equal to about 1.25 nm.

The second layer may include a zinc sulfide or ZnS. The second layer may not include selenium. The second layer may be disposed directly on the first layer. The second layer may be an outermost layer of the quantum dot. A thickness of the second layer may be greater than or equal to about 0.15 nm, greater than or equal to about 0.16 nm, greater than or equal to about 0.17 nm, greater than or equal to about 0.18 nm, greater than or equal to about 0.19 nm, or greater than or equal to about 0.2 nm and less than or equal to about 0.7 nm, less than or equal to about 0.65 nm, less than or equal to about 0.5 nm, less than or equal to about 0.45 nm, or less than or equal to about 0.4 nm.

In the quantum dots, a mole ratio of sulfur with respect to selenium (S:Se) may be less than or equal to about 2.5:1, for example, less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, less than or equal to about 1:1, less than or equal to about 0.9:1, less than or equal to about 0.8:1, or less than or equal to about 0.7:1. In the quantum dots, a mole ratio of sulfur with respect to selenium (S:Se) may be greater than or equal to about 0.1:1, greater than or equal to about 0.2:1, greater than or equal to about 0.3:1, greater than or equal to about 0.4:1, or greater than or equal to about 0.5:1.

In the (core-shell) quantum dot(s) or the alloy semiconductor nanocrystalline core, a mole ratio of zinc with respect to a sum of indium and gallium (Zn:(In+Ga)) may be greater than or equal to about 10:1, greater than or equal to about 15:1, greater than or equal to about 20:1, greater than or equal to about 25:1, greater than or equal to about 30:1, greater than or equal to about 35:1, greater than or equal to about 40:1, greater than or equal to about 45:1, or greater than or equal to about 50:1. In the (core-shell) quantum dot(s), a mole ratio of zinc with respect to a sum of indium and gallium (Zn:(In+Ga)) may be less than or equal to about 90:1, less than or equal to about 80:1, less than or equal to about 70:1, less than or equal to about 65:1, less than or equal to about 60:1, less than or equal to about 55:1, less than or equal to about 50:1, less than or equal to about 45:1, less than or equal to about 40:1, less than or equal to about 35:1, or less than or equal to about 30:1.

In the (core-shell) quantum dot(s), a mole ratio of zinc with respect to indium (Zn:In) may be greater than or equal to about 30:1, greater than or equal to about 35:1, greater than or equal to about 40:1, greater than or equal to about 50:1, or greater than or equal to about 55:1. In the (core-shell) quantum dot(s) or the alloy semiconductor nanocrystal core of an embodiment, a mole ratio of zinc with respect to indium may be less than or equal to about 90:1, less than or equal to about 80:1, less than or equal to about 70:1, less than or equal to about 65:1, less than or equal to about 60:1, less than or equal to about 55:1, or less than or equal to about 50:1.

In the (core-shell) quantum dot(s), a mole ratio of sulfur with respect to indium (S:In) may be greater than or equal to about 2:1, greater than or equal to about 5:1, greater than or equal to about 7:1, greater than or equal to about 9:1, greater than or equal to about 10:1, greater than or equal to about 12:1, or greater than or equal to about 15:1. In the (core-shell) quantum dot(s), a mole ratio of sulfur with respect to indium (S:In) may be less than or equal to about 30:1, less than or equal to about 29:1, less than or equal to about 28:1, less than or equal to about 27:1, less than or equal to about 26:1, less than or equal to about 25:1, less than or equal to about 24:1, less than or equal to about 23:1, less than or equal to about 22:1, less than or equal to about 21:1, less than or equal to about 20:1, or less than or equal to about 19:1.

In the (core-shell) quantum dot(s), a mole ratio of selenium with respect to indium (Se:In) may be greater than or equal to about 10:1, greater than or equal to about 15:1, greater than or equal to about 20:1, greater than or equal to about 25:1, or greater than or equal to about 30:1. In the (core-shell) quantum dot(s), a mole ratio of selenium with respect to indium (Se:In) may be less than or equal to about 50:1, less than or equal to about 45:1, less than or equal to about 40:1, less than or equal to about 35:1, or less than or equal to about 30:1.

The present inventors have found that adopting the aforementioned alloy core and the shell composition may make it possible for the quantum dot of an embodiment to provide a quantum dot (polymer) composite having improved absorption of excitation light together with enhanced luminous efficiency. In a quantum dot(s) of an embodiment, the (e.g., ZnSe-based) first layer (e.g., having a thickness of within the aforementioned range) may have a positive influence on increasing quantum dot luminous efficiency, and the (e.g., ZnS-based) second layer (e.g., having a thickness of within the aforementioned range) may contribute to achieving, maintaining, or a combination thereof an improved excitation light (e.g., blue light) absorption substantially without an adverse influence or effect on luminous efficiency for example, when the quantum dots are formed into a composite film of a quantum dot-polymer composite.

In addition, the quantum dot(s) of an embodiment having the aforementioned structure and the shell composition may exhibit an enhanced chemical stability. Accordingly, for example, even when the quantum dots of an embodiment go through a process of preparing a composition (e.g., a photosensitive composition or a photoresist) accompanying contacts with various chemical materials (e.g., an organic polymer, an organic solvent, a monomer, and various additives), or a process of forming a composite (or a pattern thereof), a resulting composition or composite (or a pattern thereof) including the same may exhibit and maintain improved photoluminescence properties.

Accordingly, the quantum dot(s) of an embodiment may have a quantum efficiency (e.g., a quantum yield) of greater than or equal to about 65%, for example, greater than or equal to about 66%, greater than or equal to about 67%, greater than or equal to about 68%, greater than or equal to about 69%, greater than or equal to about 70%, greater than or equal to about 71%, greater than or equal to about 72%, greater than or equal to about 73%, greater than or equal to about 74%, or greater than or equal to about 75%.

The present inventors have fond that a light absorption at a wavelength of about 350 nm may reflect absorption of the first layer (e.g., ZnSe) and the second layer (e.g., ZnS) (for example, depending on a size thereof), and a light absorption at a wavelength of about 450 nm may reflect absorption at a wavelength of blue light source that may be provided in a device including a quantum dot based color filter. Accordingly, in the UV-Vis absorption spectrum of the quantum dot(s), an absorbance ratio of 450 nm with respect to about 350 nm may reflect a capability of the quantum dot absorbing blue light according to a volume of the shell of the quantum dot. In an embodiment, the quantum dots have the shell composition described herein and as an absorbance ratio of 450 nm with respect to about 350 nm increases, a film including the quantum dots may show, e.g., exhibit, a greater level of blue light absorption. Therefore, in the UV-Vis absorption spectrum of the quantum dots of an embodiment, a ratio of absorbance at 450 nm with respect to absorbance at 350 nm may be greater than or equal to about 0.08, for example, greater than or equal to about 0.09, greater than or equal to about 0.10, or greater than or equal to about 0.11.

In an embodiment, the quantum dot(s) may have an extinction coefficient per mole at about 450 nm of greater than or equal to about $1.2 \times 10^5$ ($M^{-1}$ $cm^{-1}$).

In an embodiment, the extinction coefficient per mole of the quantum dots may be obtained as below: "a" liters of a quantum dot solution including quantum dots is diluted "n" times and is placed in a 1 cm quartz cuvette, and a spectrophotometer (e.g., Agilent Cary5000) is used to perform a UV-VIS absorption analysis for this solution. From the obtained absorption spectrum, the absorbance (A) at 450 nm is determined. A molar value of quantum dot particles included in the quantum dot solution is measured ("b" moles). The absorbance (A) is multiplied by the dilution ratio (n) and then, is divided by a concentration in mole per liter (mole/L) of the quantum dot to obtain an extinction coefficient based on the following equation.

Absorbance=(extinction coefficient)*(light-passing length)*(concentration)

Extinction coefficient per gram=$A*n/(b/a)=A*n*a/b$

A: absorbance as measured
n: dilution ratio
a: volume (L) of the quantum dot solution before dilution
b: mole of the quantum dots included in the quantum dot solution.

In an embodiment, a wavelength of a first absorption peak in an UV-Vis absorption spectrum of the quantum dot(s) may be greater than or equal to about 450 nm and less than a photoluminescent peak wavelength. In an embodiment, the first absorption peak wavelength may be greater than or equal to about 455 nm, greater than or equal to about 460 nm, greater than or equal to about 465 nm, greater than or equal to about 470 nm, greater than or equal to about 475 nm, or greater than or equal to about 480 nm, greater than or equal to about 485 nm, greater than or equal to about 490 nm; and/or less than or equal to about 530 nm, less than or equal to about 525, less than or equal to about 520 nm, less than or equal to about 515 nm, or less than or equal to about 510 nm.

A size (or an average size) of the (core-shell)quantum dot(s) may be greater than or equal to about 4 nm, greater than or equal to about 4.5 nm, greater than or equal to about 5 nm, greater than or equal to about 5.5 nm, greater than or equal to about 6 nm, greater than or equal to about 6.5 nm, or greater than or equal to about 7 nm. A size (or an average size) of the (core-shell)quantum dot(s) may be less than or equal to about 10 nm, less than or equal to about 9 nm, less than or equal to about 8 nm, or less than or equal to about 7 nm.

A shape of the quantum dots is not particularly limited, and may for example be a spherical shape, a polyhedron shape, a pyramid shape, a multi-pod shape, or a cube shape, a nanotube, a nanowire, a nanofiber, a nanosheet, or a combination thereof, but is not limited thereto.

The quantum dot(s) may be prepared in the following method. Thus, the quantum dot may include an organic ligand, the organic solvent (e.g., native ligand attached during a production process thereof), or a combination thereof which will be described herein, on a surface thereof. The organic ligand, the organic solvent, or the combination thereof may be bound to the surface(s) of the quantum dot(s).

A method of producing the aforementioned quantum dot(s) according to embodiment includes:
 activating (e.g., heating for example under vacuum) a mixture including an indium precursor, a zinc precursor, and a sulfur precursor, and optionally an organic ligand in an organic solvent;
 adding a gallium precursor and a phosphorus precursor in the activated (heated) mixture; and
 carrying out a reaction at a reaction temperature to synthesize the alloy semiconductor nanocrystal core, wherein the gallium precursor does not include an oxygen containing moiety or a halogen containing moiety.

The synthesis of the alloy semiconductor nanocrystal core may be carried out in the presence of an organic acid. The organic acid may include a C10 or greater fatty acid such as laurylic acid, oleic acid, stearic acid, or the like. In the synthesis of the alloy semiconductor nanocrystal, the phosphorous precursor and the gallium precursor may be added in a hot injection manner by injecting them at a heated state.

Details of the quantum dots and the alloy semiconductor nanocrystal are the same as set forth herein.

The present inventors have found that the alloy semiconductor nanocrystals having the aforementioned composition and the structure may be prepared by the chemical wet method described herein. Without wishing to be bound by any theory, it is believed that the method of an embodiment considers (or control) the difference between the indium/gallium/phosphorous, a high oxidization ability (or an oxygen affinity) of the gallium precursor, the absence of the gallium precursor with an appropriate reactivity, or a combination thereof, which the present inventors have found otherwise may hurdle, e.g., hinder, the synthesis of a desired composition of an alloyed semiconductor nanocrystal.

Without wishing to be bound by any theory, it is believed that in the method of an embodiment, the indium precursor may be reacted with the phosphorous precursor in the presence of the zinc precursor, which may hold up a reaction between the indium-phosphorous reaction, and at the same time the oxidation ability of the gallium is suppressed and the reactivity of the gallium precursor is controlled. Thus, the method of an embodiment may synthesize the quantum dots or the alloy semiconductor nanocrystal of the aforementioned composition and the structure (e.g., having a composition of InGaZnPS wherein the indium phosphide is alloyed with a material of a large bandgap energy to show, e.g., have, a zinc blende crystal structure).

In the method of an embodiment, the zinc precursor and the sulfur precursor may be activated (heated) together with the indium precursor in the presence of the organic ligand and the organic solvent. Without wishing to be bound by any theory, it is believed that the presence of the zinc precursor may make it possible to achieve a controlled synthesis of a particle and to contribute to securing a desired reactivity with the gallium. In addition, without wishing to be bound by any theory, it is believed that in the method of an embodiment, the gallium precursor without an oxygen-gallium bond (e.g., an ionic bond or a covalent bond) may be added into a reaction medium including an activated sulfur precursor, and thus an intermediate stabilization may occur for the gallium precursor to have a controlled reactivity, which also contributes to securing a reactivity with the phosphorous precursor.

A temperature of the activation (or the heating) may be greater than or equal to about 70° C., for example, greater than or equal to about 80° C., or greater than or equal to about 90° C. and less than or equal to about 200° C., for example, less than or equal to about 150° C., or less than or equal to about 100° C. An activation time may be selected appropriately. In an embodiment, the activation (or the heating) time may be greater than or equal to about 10 minutes, for example, greater than or equal to about 20 minutes, or greater than or equal to about 30 minutes and less than or equal to about 200 minutes, less than or equal to about 150 minutes, or less than or equal to about 100 minutes. The activation may be carried out under vacuum. The temperature of the activated mixture may not be dropped under a temperature of less than or equal to about 50° C. In an embodiment, the mixture may be kept at a temperature of greater than or equal to the activation temperature.

To the activated (heated) mixture are added the gallium precursor and the phosphorous precursor and the temperature of a resulting mixture thus obtained is raised to a reaction temperature to carry out a reaction, synthesizing the alloy semiconductor nanocrystal.

The injection temperature may be greater than or equal to about 70° C., greater than or equal to about 80° C., or greater than or equal to about 90° C. and less than or equal to about 200° C., less than or equal to about 150° C., or less than or equal to about 100° C. The reaction temperature may be greater than or equal to about 250° C., greater than or equal to about 260° C., greater than or equal to about 270° C., greater than or equal to about 280° C., greater than or equal to about 290° C., or greater than or equal to about 300° C. The reaction temperature may be less than or equal to about 380° C., less than or equal to about 360° C., less than or equal to about 340° C., less than or equal to about 320° C., less than or equal to about 300° C., less than or equal to about 290° C., or less than or equal to about 280° C. The reaction time may be selected taking into consideration the types of the precursor/the reaction temperature/the desired size of the alloy semiconductor nanocrystal, or the like. The reaction time may be greater than or equal to about 30 minutes, greater than or equal to about 40 minutes, greater than or equal to about 50 minutes, greater than or equal to about 60 minutes, greater than or equal to about 70 minutes, greater than or equal to about 80 minutes, greater than or equal to about 90 minutes, greater than or equal to about 100 minutes, greater than or equal to about 110 minutes, greater than or equal to about 120 minutes, greater than or equal to about 130 minutes, or greater than or equal to about 140 minutes. The reaction time may be less than or equal to about 10 hours, less than or equal to about 9 hours, less than or equal to about 8 hours, less than or equal to about 7 hours, less than or equal to about 6 hours, less than or equal to about 5 hours, less than or equal to about 4 hours, less than or equal to about 3 hours, less than or equal to about 2 hours, or less than or equal to about 1 hours.

The synthesized core may be recovered in an appropriate manner (e.g., using a non-solvent precipitation that will be described herein) and re-dispersed in an appropriate organic solvent (e.g., toluene or octadecene), and if desired added in the shell formation process that will be described in detail herein.

The method may further include reacting a zinc precursor with a chalcogen precursor (e.g., a sulfur precursor, a selenium precursor, or a combination thereof) in the presence of the (semiconductor nanocrystal) core in an organic solvent in the presence of the synthesized alloy semiconductor nanocrystal (or a core including the same, hereinafter "core") to form the semiconductor nanocrystal shell on the (semiconductor nanocrystal) core.

In case where the semiconductor nanocrystal shell is a multi-layered shell, the shell formation may include:
  obtaining a first mixture including a first shell precursor containing zinc, an organic ligand, and an organic solvent;
  optionally heating the first mixture;
  injecting the synthesized core (as optionally not being heated) and a selenium containing precursor to the (optionally heated) first mixture and heating the same to form a first layer including ZnSe; and
  to a reaction medium including a particle including the first layer formed on the core, injecting a sulfur containing precursor and carrying out a reaction to form a second layer including ZnS,
  wherein an amount of the selenium containing precursor and an amount of the sulfur containing precursor with respect to the core are controlled respectively (and optionally controlling a duration of a reaction in each step) in order for a resulting quantum dot to satisfy the aforementioned shell composition.

The particles including a shell of a desired composition may be recovered by a non-solvent precipitation manner that will be described in detail.

The optional heating of the first mixture may be carried out at a first temperature, for example greater than or equal to about 100° C., greater than or equal to about 120° C., greater than or equal to about 150° C., greater than or equal to about 200° C., and/or less than or equal to about 300° C., less than or equal to about 250° C. under vacuum, an inert atmosphere, or a combination thereof.

In the shell formation, a temperature of injecting the precursors may be greater than or equal to about the first temperature. A shell forming temperature may be greater than or equal to about 250° C., greater than or equal to about 260° C., greater than or equal to about 270° C., greater than or equal to about 280° C., greater than or equal to about 290° C., or greater than or equal to about 300° C. In an embodiment, the shell forming temperature may be less than or equal to about 380° C., less than or equal to about 370° C., less than or equal to about 360° C., less than or equal to about 350° C., less than or equal to about 340° C., less than or equal to about 330° C., less than or equal to about 320° C., less than or equal to about 310° C., less than or equal to about 300° C., less than or equal to about 290° C., or less than or equal to about 280° C.

The reaction time for the shell formation may be selected taking into consideration the types of the precursor/the reaction temperature/the desired size of the quantum dots, or the like. The reaction time may be greater than or equal to about 30 minutes, greater than or equal to about 40 minutes, greater than or equal to about 50 minutes, greater than or equal to about 60 minutes, greater than or equal to about 70 minutes, greater than or equal to about 80 minutes, greater than or equal to about 90 minutes, greater than or equal to about 100 minutes, greater than or equal to about 110 minutes, greater than or equal to about 120 minutes, greater than or equal to about 130 minutes, or greater than or equal to about 140 minutes. The reaction time may be less than or equal to about 10 hours, less than or equal to about 9 hours, less than or equal to about 8 hours, less than or equal to about 7 hours, less than or equal to about 6 hours, less than or equal to about 5 hours, less than or equal to about 4 hours, less than or equal to about 3 hours, less than or equal to about 2 hours, or less than or equal to about 1 hours.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RHPOOH (wherein, R and R' are independently a C1 to C40 aliphatic hydrocarbon group (e.g., a C1 to C40 or a C3 to C24 alkyl group, a C2 to C40 or a C3 to C24 alkenyl group, a C2 to C40 or a C3 to C24 alkynyl group), or a C6 to C20 aromatic hydrocarbon group (e.g., a C6 to C20 aryl group)), or a combination thereof. The organic ligand may coordinate, e.g., to or be bound to, the surface of the obtained nanocrystal and may help the nanocrystal to be well dispersed in the solution, affect light emitting and electrical characteristics of quantum dots, or a combination thereof. The formation of the alloy semiconductor nanocrystal may include using RCOOH, $R_3P$, or a combination thereof as an organic ligand.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, or dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, a triphenyl phosphine compound, or an oxide compound thereof; a C5 to C20 alkylphosphinic acid or a C5 to C20 alkyl phosphonic acid such as phosphonic acid, hexylphosphinic acid, octylphosphinic acid, dodecanephosphinic acid, tetradecanephosphinic acid, hexadecanephosphinic acid, or octadecanephosphinic acid; and the like, but are not limited thereto. The organic ligand may be used alone or as a mixture of two or more.

The organic solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. The type and the content of the solvent may be appropriately selected taking into consideration types and amounts of the used precursors and organic ligands.

The indium precursor may include a C10 to C40 carboxylate moiety. Types of the indium precursor may be indium nitrate, indium hydroxide, indium fluoride, indium chloride, indium bromide, indium iodide, indium oxide, indium sulfate, indium carboxylate, indium acetate, indium acetylacetonate, indium laurate or a combination thereof.

Types of the zinc precursor (or the first shell precursor, hereinafter, zinc precursor) are not particularly limited and may be appropriately selected. The zinc precursor may include a Zn metal powder, an alkylated Zn compound, a Zn alkoxide, a Zn carboxylate, Zn nitrate, Zn chlorate, Zn sulfate, Zn acetylacetonate, a Zn halide, Zn cyanide, Zn hydroxide, Zn oxide, Zn peroxide, or a combination thereof. Examples of the zinc precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, and the like. The zinc precursor may be used alone or in combination of two or more thereof. The zinc precursor for the formation of the alloy semiconductor nanocrystal may include a C10 to C40 carboxylate moiety.

In the formation of the alloy semiconductor nanocrystal formation, the shell formation, or a combination thereof, types of the sulfur precursor (or the sulfur containing precursor, hereinafter, sulfur precursor) are not particularly limited and may be appropriately selected. The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof. In the formation of the alloy semiconductor nanocrystal, the sulfur precursor may include a C1 to C40 alkyl thiol compound (e.g., hexane thiol, octane thiol, decane thiol, dodecane thiol, hexadecane thiol). In the shell formation, the sulfur precursor may include mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, ammonium sulfide, sodium sulfide, or a combination thereof. The sulfur precursor (e.g., during the shell formation) may be injected one or more times (e.g., two or more times).

The gallium precursor may include a gallium compound having a same or different C1 to C40 (or C10, C5, C10-05, or less) hydrocarbon group (alkyl, alkenyl, alkynyl, or the like). The hydrocarbon group may be three or less. The gallium precursor may include triethyl gallium, trimethyl gallium, tripropyl gallium, diethylmethyl gallium, dimethylethyl gallium, tributyl gallium, or a combination thereof. The gallium precursor may not include gallium acetylacetonate, a gallium carboxylate, a gallium oxide, a gallium nitrate, a gallium sulfate, a gallium fluoride, a gallium chloride, a gallium bromide, a gallium iodide, or a combination thereof.

The type of the phosphorus precursor is not particularly limited and may be appropriately selected. The phosphorus precursor may include tris(trimethylsilyl) phosphine, tris(dimethylamino)phosphine, triethylphosphine, tributylphosphine, trioctylphosphine, triphenylphosphine, tricyclohexylphosphine, or a combination thereof.

The types of the selenium precursor are not particularly limited and may be appropriately selected. For example, the selenium precursor may be selenium-trioctylphosphine (Se-TOP), selenium-tributylphosphine (Se-TBP), selenium-triphenylphosphine (Se-TPP), or a combination thereof, but is not limited thereto.

In the alloy nanocrystal formation, the shell formation, or a combination thereof, a ratio among the precursors present in the reaction system may be selected in light of the reactivity therebetween, the reaction temperature, a desired composition in a final quantum dot, or the like. In the alloy nanocrystal formation, the shell formation, or the combination thereof, each of the precursors may be added at least once (e.g., at least twice, or at least third times).

In the formation of the alloy semiconductor nanocrystal, an amount of a phosphorous precursor with respect to one mole of indium may be greater than or equal to about 0.5 moles, greater than or equal to about 1 moles, greater than or equal to about 1.5 moles, or greater than or equal to about 2 moles; and/or less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles. In the formation of the alloy semiconductor nanocrystal, an amount of a sulfur precursor with respect to one mole of indium may be greater than or equal to about 0.5 moles, greater than or equal to about 1 moles, greater than or equal to about 1.5 moles, or greater than or equal to about 2 moles; and/or less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles. In an embodiment, an amount of a gallium precursor with respect to one mole of indium may be greater than or equal to about 0.4 moles, greater than or equal to about 0.5 moles, greater than or equal to about 1 moles, greater than or equal to about 1.5 moles, greater than or equal to about 2 moles and less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles. In the formation of the alloy semiconductor nanocrystal, an amount of a zinc precursor with respect to one mole of indium may be greater than or equal to about 0.5 moles, greater than or equal to about 1 moles, greater than or equal to about 1.5 moles, or greater than or equal to about 2 moles; and/or less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

In the shell formation, an amount of the selenium may be selected appropriately. In the shell formation, an amount of the selenium precursor per one mole of indium may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. In the shell formation, an amount of the selenium precursor per one mole of indium may be less than or equal to about 20 moles, less than or equal to about 18 moles, or less than or equal to about 15 moles.

In an embodiment, an amount of sulfur with respect to one mole of indium during the shell formation may be controlled to obtain a desired shell composition (for example, such that the thickness thereof is less than or equal to about 0.7 nm) taking into consideration the reactivity of the precursor and the reaction temperature.

In the shell formation, an amount of the sulfur precursor per one mole of the indium may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. In the shell formation, an amount of the sulfur precursor per one mole of the indium may be less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles.

The addition of a nonsolvent to the prepared final reaction solution may allow nanocrystals coordinated with the organic ligands to be separated (e.g., precipitated). The nonsolvent may be a polar solvent that is miscible with the solvent used in the reaction and nanocrystals are not dispersible therein. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to the washing solvent and then washed as desired. The washing solvent is not particularly limited, and a solvent having a solubility parameter similar to that of the organic solvent or the ligand may be used. Examples thereof may include hexane, heptane, octane, chloroform, toluene, and benzene.

In an embodiment, the composition may include (e.g., a plurality of) the aforementioned quantum dot(s); a dispersing agent; and an (organic) solvent, liquid vehicle, or a combination thereof. The dispersing agent may disperse the quantum dots. The composition may further include a carboxylic acid group-containing compound (e.g., a monomer or a binder polymer). The composition may further include a (photo) polymerizable monomer including a carbon-carbon double bond, and optionally (thermal or photo) initiator. The composition may have photosensitivity.

Details of the quantum dots in the composition are as described herein. An amount of quantum dots in the composition may be appropriately adjusted in view of the desired end use (e.g., a color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of composition. The amount of the quantum dots may be less than or equal to about 70 wt %, for example, less than or equal to about 65 wt %, less than or equal to about 60 wt %, less than or equal to about 55 wt %, or less than or equal to about 50 wt %, based on a solid content of the composition. The weight percentage of the components relative to the total solids content in the composition may represent the contents of the components in the composite, which will be described herein.

The composition according to an embodiment may be used to provide a quantum dot-polymer composite pattern. The composition according to an embodiment may be a photoresist composition including quantum dots applicable to a photolithography method. The composition according to an embodiment may be an ink composition that may provide a pattern by printing (e.g., a droplet discharge method such as inkjet printing). The composition according to an embodiment may not include a conjugated (or conductive) polymer (except a cardo binder that will be described herein). The composition according to an embodiment may include a conjugated polymer. Herein, the conjugated polymer refers to a polymer having a conjugation double bond in a main chain of the polymer (e.g., polyphenylenevinylene, etc.).

In the composition according to an embodiment, the dispersing agent may ensure dispersion of the quantum dots. In an embodiment, the dispersing agent may be a binder (or binder polymer). The binder polymer may include a carboxylic acid group (e.g., in a repeating unit thereof). The binder may be a carboxylic acid group-containing compound (monomer or polymer). The binder may include a carboxylic acid group-containing compound. The binder may be an insulating polymer.

The carboxylic acid group-containing binder polymer may include a copolymer of a monomer combination including a first monomer including a carboxylic acid group and a carbon-carbon double bond, a second monomer having a carbon-carbon double bond and a hydrophobic moiety and not including a carboxylic acid group, and optionally a third monomer including a carbon-carbon double bond and a hydrophilic moiety and not including a carboxylic acid group; a multiple aromatic ring-containing polymer having a backbone structure where two aromatic rings are bound to a quaternary carbon atom that is a constituent atom of another cyclic moiety in the main chain and including a carboxylic acid group (—COOH) (hereinafter, cardo binder); or a combination thereof. The dispersing agent may include the first monomer, the second monomer, and optionally the third monomer.

In the composition, an amount of the dispersing agent or the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight (or the solid content) of the composition, but is not limited thereto. The amount of the binder polymer may be less than or equal to about 55 wt %, for example less than or equal to about 50 wt %, less than or equal to about 40 wt %, less than or equal to about 35 wt %, less than or equal to about 33 wt %, or less than or equal to about 30 wt %, based on a total weight (or the solid content) of the composition. The amount of the binder polymer may be about 0.5 wt % to about 55 wt %, based on a total weight of a solid content of the composition.

In the composition, the polymerizable (e.g., photopolymerizable) monomer (hereinafter, may be referred to as "monomer") including the carbon-carbon double bond may include (e.g., photopolymerizable) (meth)acryl-based monomer. The monomer may be a precursor for an insulating polymer.

An amount of the monomer may be greater than or equal to about 0.5 wt %, for example, greater than or equal to about 1 wt %, or greater than or equal to about 2 wt %, based on a total weight of the composition. The amount of the monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The (photo)initiator included in the composition is a compound that initiates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted considering types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition (or the polymer matrix that will be described herein) may further include a (multiple or monofunctional) thiol compound having a, e.g., at least one, thiol group at a terminal end thereof, a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or a solid content thereof) of the composition.

The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1000 nm or less than or equal to about 800 nm.

The multiple thiol compound may be a dithiol compound, a trithiol compound, a tetrathiol compound, or a combination thereof. For example, the thiol compound may be glycoldi-3-mercaptopropionate, glycol dimercaptoacetate, trimethylolpropane-tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt %, based on a total weight (or a total weight of the solid content) of the composition.

The composition may further include an organic solvent (or a liquid vehicle, hereinafter referred to as a solvent). Types of the usable organic solvent are not particularly limited.

Examples of the solvent may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; glycol ether acetates such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate or dipropylene glycol monoethyl ether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum product such as toluene, xylene, or solvent naphtha; an ester such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

Types and amounts of the solvent may be appropriately selected by taking into consideration the aforementioned main components (i.e., the quantum dot, the dispersing agent, the photopolymerizable monomer, the photoinitiator, and if used, the thiol compound), and types and amounts of additives which will be described herein. The composition may include a solvent in a residual amount except for a desired amount of the solid content (non-volatile components).

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. Together with the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 37 mN/m, less than or equal to about 36 mN/m, less than or equal to about 35 mN/m, less than or equal to about 34 mN/m, less than or equal to about 33 mN/m, or less than or equal to about 32 mN/m. A surface tension of the ink composition may be less than or equal to about 31 mN/m, less than or equal to about 30 mN/m, less than or equal to about 29 mN/m, or less than or equal to about 28 mN/m.

If desired, the composition may further include various additives such as a light diffusing agent, a leveling agent, or a coupling agent in addition to the aforementioned components.

The components (binder, monomer, solvent, additive, thiol compound, cardo binder, etc.) included in the composition (e.g., a photoresist composition) of an embodiment may be appropriately selected, for details described in, for example, US-2017-0052444-A1 may be referred.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., acryl-based monomer), optionally, the thiol compound, optionally, the metal oxide particulates, and optionally, the aforementioned additive. Each of the aforementioned components may be mixed sequentially or simultaneously, but mixing orders are not particularly limited.

The composition may provide a quantum dot-polymer composite by a (e.g., radical) polymerization.

In an embodiment, the quantum dot (polymer) composite includes a polymer matrix; and the aforementioned quantum dot dispersed in the polymer matrix. The (polymer) matrix may include a linear polymer, a crosslinked polymer, or a combination thereof. The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof. The linear polymer may include a repeating unit derived from carbon-carbon unsaturated bonds (e.g., carbon-carbon double bond). The repeating unit may include a carboxylic acid group. The linear polymer may include an ethylene repeating unit.

The polymer matrix may include a dispersing agent (e.g., a binder polymer including a carboxylic acid group), a polymerization product (e.g., insulating polymer) of a polymerizable monomer having a carbon-carbon double bond (at least one, for example, at least two, at least three, at least four, or at least five), optionally a polymerization product of the polymerizable monomer and a thiol compound (e.g., a monothiol having one thiol group or a polythiol compound having at least two thiol groups at a terminal end thereof, or a combination thereof). The quantum dot-polymer composite may further include the aforementioned metal oxide particulate.

In an embodiment, the polymer matrix may include a cross-linked polymer and a dispersing agent (e.g., (carboxyl group-contained) binder polymer). The polymer matrix may not include a conjugated polymer (excepting cardo resin). The cross-linked polymer may include a thiolene resin, a cross-linked poly(meth)acrylate, or a combination thereof. In an embodiment, the cross-linked polymer may be a polymerization product of the polymerizable monomer and, optionally, the multiple thiol compound.

The quantum dot, the dispersing agent, or the binder polymer, the polymerizable monomer, and the multiple thiol compound may be the same as described herein.

A film of the quantum dot-polymer composite (or a pattern thereof as described herein) may have for example a thickness of less than or equal to about 30 micrometers (μm), for example, less than or equal to about 25 μm, less than or equal to about 20 μm, less than or equal to about 15 μm, less than or equal to about 10 μm, less than or equal to about 8 μm, or less than or equal to about 7 μm and greater than or equal to about 2 μm, for example, greater than or equal to about 3 μm, greater than or equal to about 3.5 μm, greater than or equal to about 4 μm, greater than or equal to about 5 μm, or greater than or equal to about 6 μm.

The quantum dot(s) according to an embodiment has an improved level of blue light absorption. Accordingly, in an embodiment, the quantum dot-polymer composite has a film shape having, for example, a thickness of about 6 micrometers (μm) or more, and if the quantum dots are included in an amount of less than or equal to about 60 wt % (e.g., less than or equal to about 45 wt % and optionally in the presence of less than or equal to about 15 wt % of a light diffusing agent, based on a total weight of the composite, an absorption with respect to blue light of a wavelength of about 450 nm may be greater than or equal to about 89%, for example, greater than or equal to about 90%, greater than or equal to about 91%, greater than or equal to about 92%, or greater than or equal to about 93%.

In an embodiment, a patterned film includes a repeating section including a first section configured to emit first light, wherein the first section includes the aforementioned quantum dot (polymer) composite. The repeating section may include a second section emitting second light having different wavelength from the first light, wherein the second section may include a quantum dot polymer composite. The quantum dot polymer composite of the second section may include a second quantum dot configured to emit the second light. The second quantum dot may include the aforementioned quantum dots. The first light or the second light may be red light having a maximum photoluminescence peak wavelength that is between about 600 nm and about 650 nm (e.g., about 620 nm to about 650 nm), or green light having a maximum photoluminescence peak wavelength that is between about 500 nm and about 550 nm (e.g., about 510 nm to about 540 nm). The patterned film may further include a third section emitting a third light (e.g., blue light) different from the first light and the second light. The third light may have a maximum peak wavelength ranging from about 380 nm to about 480 nm. The third section can allow the blue excitation light to pass through the patterned film of the quantum dot polymer composite, as disclosed herein.

In an embodiment, a display device includes a light source and a photoluminescent element, and the photoluminescent element includes a light emitting layer, and the light emitting layer includes a film or a patterned film of the quantum dot-polymer composite. The light emitting layer may be disposed on a (e.g., transparent) substrate. The light source is configured to provide the photoluminescent element with incident light. The incident light may have a luminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In the light emitting layer (e.g., patterned film of quantum dot polymer composite) of the display device according to an embodiment, the first section may be a section emitting red light, and the second section may be a section emitting green light, and the light source may be an element emitting blue light and optionally green light.

In an embodiment, on a front side (i.e., light emitting face) of the first section and the second section may be disposed a first optical element cutting (e.g., absorbing or reflecting) blue light and optionally green light.

In the aforementioned display device, the light source includes a plurality of light emitting units respectively corresponding to the first section and the second section, and the light emitting units may include a first electrode and a second electrode each having a surface opposite the other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) are not particularly limited. The light source includes an organic light emitting diode (OLED) emitting blue light (and optionally, green light).

Figure 2:
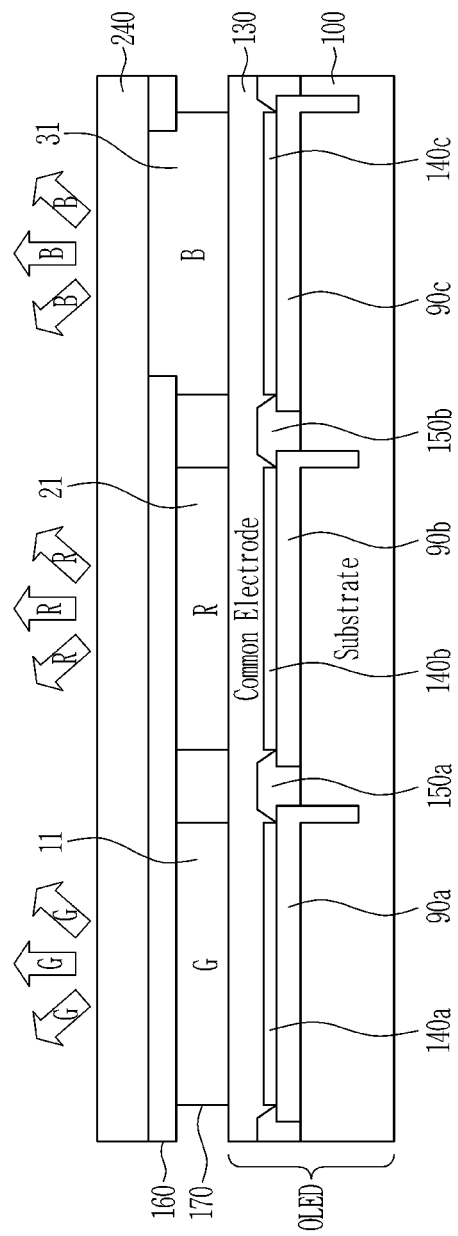
FIG. 2 is a schematic view showing a cross-section of a display device according to an embodiment.

FIG. 1 is a schematic cross-sectional view of a display device according to an embodiment, and FIG. 2 is a schematic cross-sectional view of a display device according to an embodiment. Referring to FIGS. 1 and 2, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode (layer) 130 formed on the organic light emitting layer 140a, 140b, 140c. A thin film transistor and a substrate may be disposed under the organic light emitting diode (OLED).

A stacked structure including a quantum dot polymer composite pattern 170 (e.g., a section 31 including or not including a quantum dot such as a blue light emitting quantum dot, a section 21 including red light emitting quantum dots, and a section 11 including green light emitting quantum dots), optical filter layer 160, and a transparent substrate (or referred to as an upper substrate) 240 may be disposed on the light source. The excitation light (e.g., blue light) emitted from the light source and incident upon the patterned sections is converted to red and green light, respectively. Blue light emitted from the light source may pass through the third section of the patterned quantum dot polymer composite. The display device may be obtained by separately producing the aforementioned stacked structure and (e.g., blue light emitting) LED or OLED and then assembling the same. The display device may be obtained by forming a quantum dot polymer composite pattern directly on the LED or OLED.

The substrate may be a substrate including an insulating material. The substrate may include glass; various polymers such as a polyester (e.g., polyethylene terephthalate (PET) or polyethylene naphthalate (PEN)), a polycarbonate, or a polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The detailed structure of the wire layer may be verified according to an embodiment.

The pixel electrode may function as an anode of the display device. The pixel electrode may be formed of a transparent conductive material or a material having a light-blocking properties, but is not limited thereto.

Between two adjacent pixel electrodes, a pixel define layer (PDL) may be overlapped with a terminal end of the pixel electrode to divide the pixel electrode into a pixel unit. The pixel define layer may be an insulation layer which may electrically block the at least two pixel electrodes.

The pixel define layer may cover a portion of the upper surface of the pixel electrode, and the remaining region of the pixel electrode where is not covered by the pixel define layer may provide an opening. An organic light emitting layer that will be described herein may be formed in the region defined by the opening.

The organic light emitting layer defines each pixel area by the aforementioned pixel electrode and pixel define layer. In other words, one pixel area may be defined as an area where is formed with one organic emission unit layer which is contacted with one pixel electrode divided by the pixel define layer.

For example, in the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belong to visible light region or belong to an ultraviolet (UV) region. In other words, each of the first to the third pixel areas of the organic light emitting layer may emit third light. In an embodiment, the third light may be a light having the highest energy in the visible light region, for example, may be blue light. When all pixel areas of the organic light emitting layer are configured to emit the same light, each pixel area of the organic light emitting layer may be all formed of the same or similar materials or may show, e.g., exhibit, the same or similar properties. Such a design of the light emitting layer may significantly simplify the processes in forming the organic light emitting layer, and therefore, a display device may be easily applied to large scale/large area processing. However, the organic light emitting layer according to an embodiment is not necessarily limited thereto, but the organic light emitting layer may be configured to emit at least two different lights.

The organic light emitting layer includes an organic emission unit layer in each pixel area, and each organic emission unit layer may further include an auxiliary layer (e.g., hole injection layer (HIL), hole transport layer (HTL), electron transport layer (ETL), etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stacked structure and the lower substrate, and in the stacked structure, the photoluminescence layer (i.e., light emitting layer) may be disposed over a face of the liquid crystal layer. The display device may further include a polarizer between the liquid crystal layer and the light emitting layer. The light source may further include LED and if desired, a light guide panel.

Figure 3:
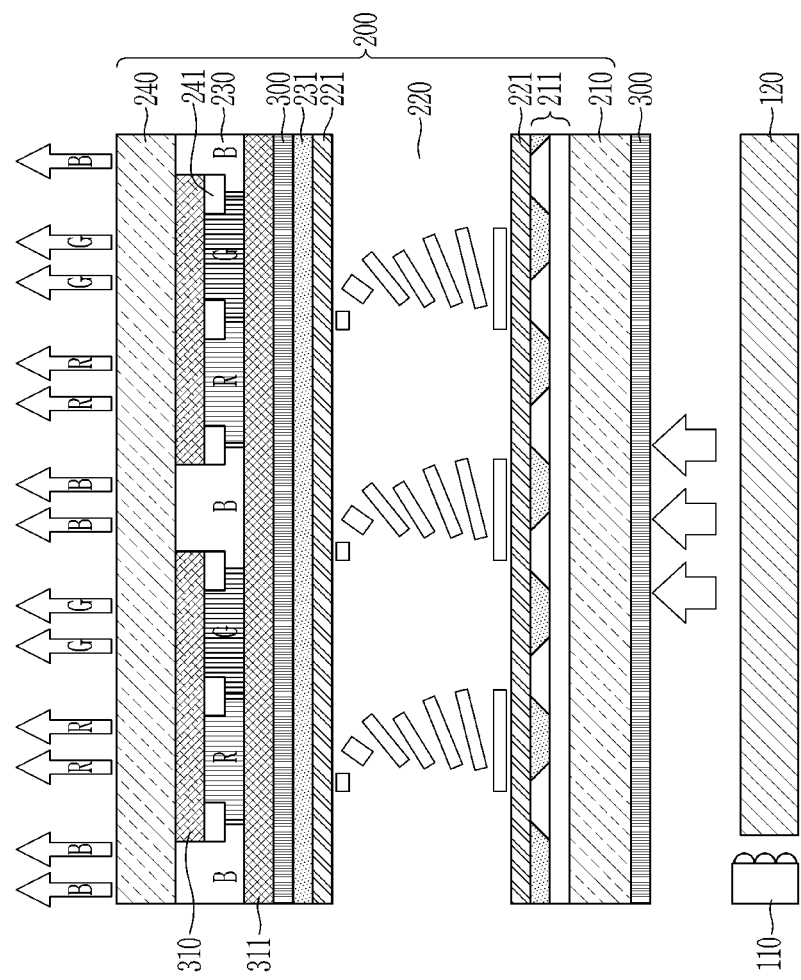
FIG. 3 is a schematic view showing a cross-section of a display device according to an embodiment.

Non-limiting examples of the display device (e.g., a liquid crystal display device) according to an embodiment are illustrated with a reference to a drawing. FIG. 3 is a schematic cross-sectional view showing a liquid crystal display according to an embodiment. Referring to FIG. 3, the display device of an embodiment includes a liquid crystal panel 200, a polarizer 300 disposed under the liquid crystal panel 200, and a backlight unit disposed under the polarizer 300.

The liquid crystal panel 200 includes a lower substrate 210, a stacked structure, and a liquid crystal layer 220 disposed between the stacked structure and the lower substrate 210. The stacked structure includes a transparent substrate (or referred to as an upper substrate) 240, an optical filter layer 310, a photoluminescent layer 230 including a pattern of a quantum dot polymer composite as described herein.

The lower substrate 210, also referred to as an array substrate, may be a transparent insulation material substrate. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal panel 200 may include an alignment layer 221 on the liquid crystal layer 220 to initially align the liquid crystal material. Details (e.g., a liquid crystal material, an alignment layer material, a method of forming liquid crystal layer, a thickness of liquid crystal layer, or the like) of the liquid crystal layer and the alignment layer are not particularly limited.

A lower polarizer 300 is provided under the lower substrate 210. Materials and structures of the polarizer 300 are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer 300 may be disposed between the liquid crystal layer 220 and the light emitting layer 230. The polarizer may be any polarizer that used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, a, e.g., at least one, optical sheet (not shown) on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet.

A black matrix (BM) 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit first light (e.g., red light), a second section (G) configured to emit second light (e.g., green light), and a third section (B) configured to emit/transmit, for example blue light. If desired, the photoluminescent layer 230 may further include a, e.g., at least one, fourth section. The fourth section may include a quantum dot that emits a light of different color from light emitted from the first to third sections (e.g., cyan, magenta, and yellow light).

In the photoluminescent layer 230, sections forming a pattern may be repeated corresponding to pixel areas formed on the lower substrate 210. A transparent common electrode 231 may be provided on the photoluminescent color filter layer.

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer as is. If desired, the third section may include a quantum dot emitting blue light.

If desired, the display device may further have a blue light blocking layer (blue cut filter) or a first optical filter layer. The blue light blocking layer or a first optical filter layer may be disposed between lower surfaces of the first section (R) and the second section (G) and the upper substrate 240 or on the upper surface of the upper substrate 240. The blue light blocking layer 310 may be a sheet having an opening in a region corresponding to a pixel area (a third section) displaying blue and thus may be formed in a region corresponding first and second sections. As shown in FIG. 3, the first optical filter layer may be integrally formed as one body structure at the remaining positions except positions overlapped with the third section, but is not limited thereto. At least two first optical filter layers may be spaced apart and be disposed on each of the positions overlapped with the first and the second sections.

In an embodiment, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, and/or yellow light that is mixed light thereof.

For example, the first optical filter layer may substantially block blue light having a wavelength of less than about 500 nm and may transmit light in other visible light wavelength region of greater than or equal to about 500 nm and less than or equal to about 700 nm.

For example, the first optical filter layer may have light transmittance of greater than or equal to about 70%, greater than or equal to about 80%, greater than or equal to about 90%, or even about 100% with respect to the other visible light of greater than or equal to about 500 nm and less than or equal to about 700 nm.

The first optical filter layer may include a polymer thin film including a dye that absorbs light having a wavelength to be blocked, a pigment that absorbs light having a wavelength to be blocked, or a combination thereof. The first optical filter layer may block at least about 80%, or at least about 90%, even at least 95% of blue light having a wavelength of less than or equal to about 480 nm and the first optical filter layer may have light transmittance of greater than or equal to about 70%, greater than or equal to about 80%, greater than or equal to about 90%, or even about 100% with respect to other visible light of greater than or equal to about 500 nm and less than or equal to about 700 nm.

The first optical filter layer may block (e.g., absorb) or substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof, wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The display device may further include a second optical filter layer (e.g., red/green or yellow light recycling layer) 311 disposed between the photoluminescence layer and the liquid crystal layer (e.g., between photoluminescence layer and upper polarizer) and transmitting at least a portion of the third light and reflecting at least a portion of the first light and the second light. The second optical filter layer may reflect light in a wavelength region of greater than or equal to about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking material having a high refractive index and material having a low refractive index.

In an embodiment, the aforementioned stacked structure may be produced by a method using a photoresist composition (e.g., the composition of an embodiment). The method may include:

forming a film of the aforementioned composition on a substrate;
exposing a selected region of the film to light (e.g., a wavelength of less than or equal to about 400 nm); and
developing the exposed film with an alkali developing solution to obtain a pattern of the quantum dot polymer composite.

Figure 4A:
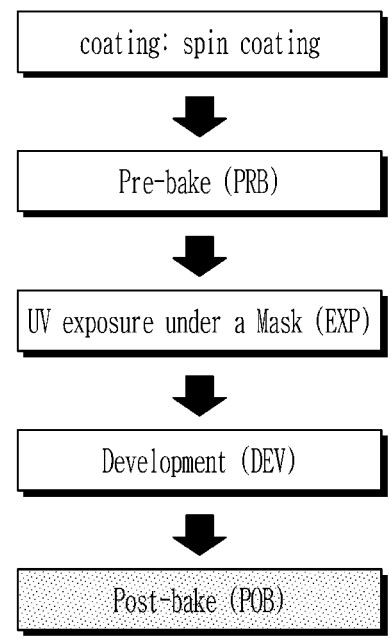
FIG. 4A schematically shows a pattern forming process using a composition according to an embodiment.
Figure 4A:
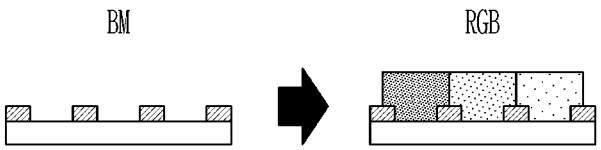

The substrate and the composition are the same as described herein. Non-limiting methods of forming the aforementioned pattern are illustrated, referring to FIG. 4A.

The aforementioned composition is coated to have a predetermined thickness on a substrate in an appropriate method of spin coating, slit coating, and the like (S1). The formed film may be, optionally, pre-baked (PRB) (S2). The pre-baking may be performed by appropriately selecting conditions of a temperature, time, an atmosphere, and the like.

The formed (or optionally pre-baked) film is exposed to light having a predetermined wavelength under a mask having a predetermined pattern (S3). A wavelength and intensity of the light may be selected considering types and amounts of the photoinitiator, types and amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

When the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and repeating the aforementioned formation process of the aforementioned pattern about each composition (S6) an appropriate number of times (e.g., twice or more or three times or more). For example, the quantum dot-polymer composite may have a pattern of at least two repetitive color sections (e.g., RGB color sections). This quantum dot-polymer composite pattern may be used as a photoluminescence-type color filter in a display device.

Figure 4B:
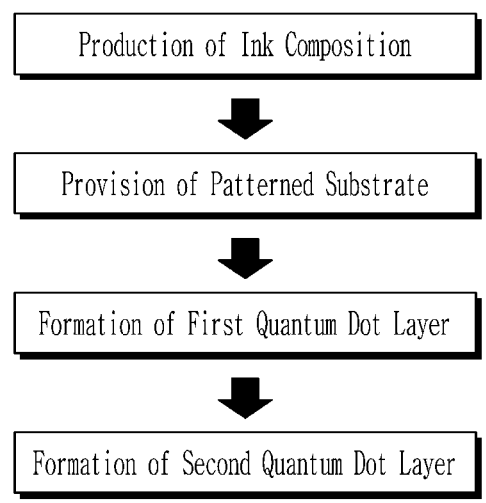
FIG. 4B schematically shows a pattern forming process using a composition according to an embodiment.

A quantum dot composite pattern may be formed by using an ink composition configured to form a pattern via an ink jet manner. Referring to FIG. 4B, the method includes preparing an ink composition; obtaining a substrate including a pattern of, for example, an electrode and optionally an pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section).

Formation of the first quantum dot layer and the second quantum dot layer may be carried out simultaneously or sequentially.

Deposition of the ink composition may be carried out using an appropriate droplet discharging system such as an ink jet printer or a nozzle printing system (e.g., having an ink reservoir and a, e.g., at least one, printer head).

The deposited ink composition may be heated to remove a solvent and optionally to carry out a polymerization, and thus, provide a (first or second) quantum dot layer. The method may provide a highly precise quantum dot-polymer composite film or pattern in a simple way for a short time.

An embodiment provides an electronic device including the aforementioned quantum dot. The electronic device may include a light emitting diode (LED), an organic light emitting diode (OLED), a sensor, a solar cell, an imaging sensor, or a liquid crystal display (LCD), but is not limited thereto.

Figure 5:
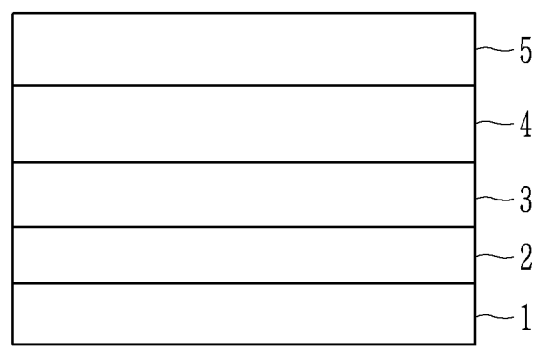
FIG. 5 is a schematic view showing a cross-section of an electroluminescent device according to an embodiment.

The quantum dots may be used in a luminescent layer in a quantum dot based electroluminescent device (see FIG. 5). The electroluminescent device may include an anode 1 and a cathode 5 facing each other; a quantum dot emission layer 3 disposed between the anode and the cathode and including a plurality of quantum dots, and a hole auxiliary layer 2 disposed between the anode and the quantum dot emission layer. The hole auxiliary layer may include a hole injecting layer (HIL), a hole transporting layer (HTL), an electron blocking layer (EBL), or a combination thereof. The hole auxiliary layer may include a suitable organic/inorganic material having a hole property. The electroluminescent device may further include an electron auxiliary layer 4 between the cathode and the quantum dot emission layer. The electron auxiliary layer may include an electron injecting layer (EIL), an electron transporting layer (ETL), a hole blocking layer (HBL), or a combination thereof. The electron auxiliary layer may include a suitable organic/inorganic material having an electron property.

Hereinafter, the embodiments are illustrated in more detail with reference to examples. However, they are exemplary embodiments of the present invention, and the present invention is not limited thereto.

EXAMPLES

Analysis Methods

1. Ultraviolet-Visible (UV-Vis) Absorption Spectroscopy

UV-Vis absorption spectroscopy is performed by using an Agilent Cary5000 spectrometer to obtain a UV-Visible absorption spectrum.

2. Photoluminescence Analysis

A Hitachi F-7000 spectrophotometer is used to obtain photoluminescence (PL) spectra of the produced quantum dots at excitation wavelength of 450 nanometers (nm).

3. Inductively Coupled Plasma (ICP) Analysis

Shimadzu ICPS-8100 is used to perform inductively coupled plasma-atomic emission spectrometry (ICP-AES).

4. Blue Light Absorption and Light Conversion Efficiency (CE) of Composite

An integral hemisphere is used to measure a light dose (B) of blue excitation light. Then, a quantum dot polymer composite is put in the integral hemisphere and irradiated by the blue excitation light to measure a green light dose (A) and a blue light dose (B') out from the composite.

A blue light absorption rate and a photoconversion rate (i.e., light conversion rate) are calculated according to the following equations.

$$\text{Blue light absorption rate (\%)} = ((B-B')/B) \times 100(\%)$$

$$\text{Light conversion rate (\%)} = (A/B) \times 100(\%)$$

Example 1-1

An indium precursor (indium laurate), a zinc precursor (zinc oleate), and a sulfur precursor (dodecane thiol) each dissolved in 1-octadecene are added to a 200 milliliter (mL) reaction flask and then, heated at 90° C. under vacuum. An atmosphere of the reactor is converted into nitrogen after one hour, and while the reactor is heated to about 280° C., triethyl gallium and tris(trimethylsilyl)phosphine ($TMS_3P$) each dispersed in trioctylphosphine are injected thereinto and then, the temperature of the reactor is increased to 300° C. to carry out a reaction for 3 hours. Subsequently, zinc oleate ($Zn(OA)_2$) as a zinc precursor is injected into the reactor.

The reaction solution is cooled down to room temperature, acetone is added thereto and then, centrifuged, and precipitates are dispersed again in toluene.

The amount of $TMS_3P$ and the amount of the sulfur are 1.5 moles and 1 mole per one mole of indium. The amount of the gallium and the Zn per one mole of indium are 0.6 moles and 2 moles, respectively.

A size of the obtained core is about 2.2 nm and a first absorption peak is about 430 nm. An ICP analysis is made and the results are compiled in Table 1.

Example 1-2

1. Selenium and sulfur are dispersed in trioctylphosphine (TOP) to obtain a Se/TOP stock solution and a S/TOP stock solution, respectively.

In a 200 mL reaction flask, zinc acetate and oleic acid are dissolved in trioctyl amine and the solution is subjected to vacuum at 120° C. for 10 minutes. The atmosphere in the reaction flask is replaced with $N_2$. While the resulting solution is heated to about 320° C., a toluene dispersion of the semiconductor nanocrystal core prepared in Example 1-1 is injected thereto and a predetermined amount of the Se/TOP stock solution is injected into the reaction flask several times and then a predetermined amount of the STOP stock solution is injected into the reaction flask several times, respectively to form quantum dots having a ZnSe/ZnS shell disposed on the semiconductor nanocrystal core.

An excess amount of ethanol is added to the final reaction mixture including the quantum dots, which is then centrifuged. After centrifugation, the supernatant is discarded and the precipitate is dried and dispersed in chloroform or toluene to obtain a quantum dot solution (hereinafter, QD solution).

Total amounts of the Se and the S as used per one mole of the indium is about 8 moles and about 18 moles, and a total reaction time is about 3 hours.

For the obtained QD, an ICP-AES analysis is made and the results are shown in Table 2. A UV-Vis absorption spectroscopic analysis and a photoluminescence spectroscopic analysis are made for the QD, and the results are shown in Table 3.

2. Production of a Quantum Dot Polymer Composite and a Pattern Thereof (1) Preparation of Quantum Dot-Binder Dispersion The prepared chloroform solution of the quantum dots is mixed with a solution of a binder polymer, which is a four membered copolymer of methacrylic acid, benzyl methacrylate, hydroxyethyl methacrylate, and styrene, (acid value: 130 milligrams (mg) of KOH per gram (mg KOH/g), molecular weight: 8,000 g/mol, methacrylic acid:benzyl methacrylate:hydroxyethyl methacrylate:styrene (mole ratio)=61.5:12:16.3:10.2) (solvent: propylene glycol monomethyl ether acetate, PGMEA, a concentration of 30 percent by weight (wt %)) to form a quantum dot-binder dispersion.

(2) Preparation of a Photosensitive Composition

To the prepared quantum dot-binder dispersion, a hexaacrylate having the following structure (as a photopolymerizable monomer), ethylene glycol di-3-mercaptopropionate (hereinafter, 2T, as a multi-thiol compound), an oxime ester compound (as an initiator), TiO$_2$ as a metal oxide fine particle, and PGMEA (as a solvent) are added to obtain a composition.

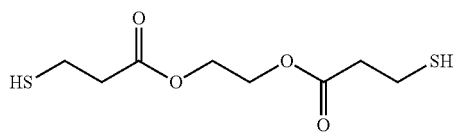 [SMILES: O=C(CCS)OCCOC(=O)CCS]

(ethylene glycol di-3-mercaptopropionate)

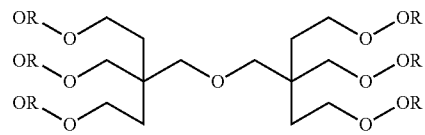

(hexaacrylate)
wherein

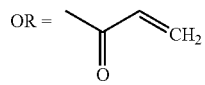

based on a total solid content, the prepared composition includes 43 wt % of quantum dots, 12.5 wt % of the binder polymer, 24 wt % of 2T, 10 wt % of the photopolymerizable monomer, 0.5 wt % of the photoinitiator, and 10 wt % of the metal oxide fine particle. The total solid content is about 25 wt %.

(3) Formation of Quantum Dot-Polymer Composite Pattern and Heat Treatment Thereof The obtained composition is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nanometers (nm), intensity: 100 millijoules (mJ)) under a mask having a predetermined pattern (e.g., a square dot or stripe pattern) for 1 second (s) (EXP) and developed with a potassium hydroxide aqueous solution (concentration: 0.043 weight %) for 50 seconds to obtain a pattern of a quantum dot polymer composite (thickness: 6 micrometers (μm)).

The obtained pattern is heat-treated at a temperature of 180° C. for 30 minutes under a nitrogen atmosphere (post-baked (POB)).

For the obtained pattern film, a blue light absorption and a photoconversion rate are measured and the results are shown in Table 4.

Example 2-1

A core is manufactured according to the same method as Example 1-1 except that 0.4 moles of gallium per 1 mole of indium is used. A size of the obtained core is about 2.1 nm and a first absorption peak is about 430 nm. An ICP analysis is made and the results are compiled in Table 1.

Example 2-2

1. A core shell quantum dot having a ZnSe/ZnS shell is prepared in the same manner as Example 1-2 except for using the core prepared in Example 2-1.

2. A quantum dot polymer composite and pattern thereof are prepared in the same manner as set forth in Example 1-2 except for using the obtained quantum dots. For the obtained pattern film, a blue light absorption and a photoconversion rate are measured and the results are shown in Table 4.

Comparative Example 1

1-1. Indium laurate and a zinc precursor (zinc oleate) each dissolved in 1-octadecene are added to a 200 milliliters (mL) reaction flask, subjected to a vacuum state at 120° C. for one hour. In one hour, the atmosphere in the reaction flask is exchanged with N$_2$. After the reaction flask is heated to 280° C., a mixed solution of tris(trimethylsilyl)phosphine (TMS$_3$P) and trioctylphosphine (TOP) is quickly injected, and the reaction proceeds for a predetermined time (e.g., for about 20 minutes). The reaction mixture then is rapidly cooled to room temperature and acetone is added thereto to produce nanocrystals, which are then separated by centrifugation and dispersed in toluene. The amount of the TMS$_3$P is about 1 mole per one mole of indium. A size of the obtained core is about 1.9 nm and a first absorption peak is about 430 nm. An ICP analysis is made and the results are compiled in Table 1.

1-2. A core shell quantum dot is prepared in the same manner as Example 1-2 except for using the prepared core.

1-3. A quantum dot polymer composite and pattern thereof are prepared in the same manner as set forth in Example 1-2 except for using the obtained quantum dots. For the obtained pattern film, a blue light absorption and a photoconversion rate are measured and the results are shown in Table 4.

Comparative Example 2

A core is manufactured according to the same method as Example 2-1 except for not using a zinc precursor. During the synthesis, precipitation occurs and the product does not show, e.g., exhibit, an absorption peak. An ICP analysis is made and the results are compiled in Table 1.

Comparative Example 3

A core is manufactured according to the same method as Example 2-1 except for not using a sulfur precursor. During the synthesis, precipitation occurs and the product does not show, e.g., exhibit, an absorption peak. An ICP analysis is made and the results are compiled in Table 1.

Comparative Example 4

A core is manufactured according to the same method as Example 2-1 except for using gallium acetylacetonate as a gallium precursor. A size of the obtained core is about 2.0 nm and a first absorption peak is about 439 nm. An ICP analysis is made and the results are compiled in Table 1.

Comparative Example 5

A core is manufactured according to the same method as Example 2-1 except for using gallium chloride as a gallium precursor. A size of the obtained core is about 2.1 nm and a first absorption peak is about 455 nm. An ICP analysis is made and the results are compiled in Table 1.

TABLE 1

|  | Zn:In | Ga:In | P:In | (In + Ga):P | (In + Ga + Zn):(P + S) |
|---|---|---|---|---|---|
| Example 1-1 | 1.97:1 | 0.59:1 | 1.34:1 | 1.19:1 | 1.70:1 |
| Example 2-1 | 1.90:1 | 0.40:1 | 1.23:1 | 1.13:1 | 1.64:1 |
| Comparative Example 1-1 | 0.36:1 | 0.00:1 | 0.86:1 | 1.16:1 | 1.16:1 |
| Comparative Example 2 | 0.00:1 | 0.30:1 | 0.98:1 | 1.33:1 | 0.88:1 |
| Comparative Example 3 | 1.47:1 | 0.40:1 | 1.49:1 | 0.94:1 | 1.93:1 |
| Comparative Example 4 | 0.86:1 | 0.14:1 | 0.80:1 | 1.42:1 | 1.41:1 |
| Comparative Example 5 | 0.42:1 | 0.14:1 | 0.35:1 | 3.26:1 | 2.05:1 |

The results of Table 1 show that in Examples 1-1 and 2-1, the InGaZnPS alloy semiconductor nanocrystals having a size of about 2 nm, In+Ga+Zn:P+S of about 1.2:1-1.7:1, and P:In of greater than 1:1 are prepared. The results of Comparative Examples 2-4 show that the ICP compositions are outside an appropriate range and an excessive amount is precipitated, failing to form a nanocrystal (i.e., an alloy semiconductor nanocrystal is not formed).

TABLE 2

|  | S:Se | P:In | Ga:In | (In + Ga):P | Zn:(In + Ga) |
|---|---|---|---|---|---|
| Example 1-2 | 0.596:1 | 1.44:1 | 0.44:1 | 1:1 | 41.7:1 |
| Example 2-2 | 0.549:1 | 1.4:1 | 0.3:1 | 0.93:1 | 41:1 |

TABLE 3

|  | 1$^{st}$ absorption peak wavelength (nm) | 450:350 ratio | Quantum yield (QY) |
|---|---|---|---|
| Example 1-2 | 498 | 0.09:1 | 75% |
| Example 2-2 | 494 | 0.08:1 | 75% |
| Comparative Example 1-2 | 495 | 0.07:1 | 75% |

TABLE 4

|  | Absorption (%) | Photoconversion rate after POB (%) |
|---|---|---|
| Example 1-2 | 91.7 | greater than 26% |
| Example 2-2 | 90.5 | greater than 26% |

TABLE 4-continued

|  | Absorption (%) | Photoconversion rate after POB (%) |
|---|---|---|
| Comparative Example 1-3 | 88.8 | greater than 26% |

The results of Table 3 and Table 4 confirm that the quantum dots prepared in Examples 1-2 and 2-2 have a high level of luminous efficiency in an individual quantum dot or in a composite form and show, e.g., exhibit, an improved absorption.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot comprising an alloy semiconductor nanocrystal comprising indium, gallium, zinc, phosphorus, and sulfur,
    wherein in the quantum dot, a mole ratio of gallium with respect to indium is greater than or equal to about 0.2:1,
    wherein in the quantum dot, a mole ratio of phosphorus with respect to indium is greater than or equal to about 0.95:1,
    wherein the quantum dot does not comprise cadmium, and
    wherein in an ultraviolet-visible absorption spectrum of the quantum dot, a first absorption peak is present in a range of less than or equal to about 520 nanometers.

2. The quantum dot of claim 1, wherein in the quantum dot, a mole ratio of gallium with respect to indium is greater than or equal to about 0.35:1.

3. The quantum dot of claim 1, wherein in the quantum dot, a mole ratio of gallium with respect to indium is greater than or equal to about 0.3:1 and less than or equal to about 1:1.

4. The quantum dot of claim 1, wherein in the quantum dot, a mole ratio of phosphorus with respect to indium is greater than or equal to about 1:1.

5. The quantum dot of claim 1, wherein in the quantum dot, a mole ratio of a sum of indium and gallium with respect to phosphorus is greater than or equal to about 0.8:1 and less than or equal to about 1.3:1.

6. The quantum dot of claim 1, wherein a wavelength of a first absorption peak in an ultraviolet-visible absorption spectrum of the alloy semiconductor nanocrystal is in a range of greater than or equal to about 400 nanometers and less than or equal to about 450 nanometers.

7. The quantum dot of claim 6, wherein in the alloy semiconductor nanocrystal, a mole ratio of zinc with respect to indium is greater than or equal to about 0.9:1.

8. The quantum dot of claim 6, wherein in the alloy semiconductor nanocrystal, a mole ratio of a sum of indium, gallium, and zinc with respect to a sum of sulfur and phosphorus is greater than or equal to about 1:1 and less than or equal to about 1.8:1.

9. The quantum dot of claim 1, wherein in the quantum dot, a mole ratio of zinc with respect to a sum of indium and gallium is greater than or equal to about 1:1.

10. The quantum dot of claim 1, wherein in the quantum dot, a mole ratio of sulfur with respect to indium is greater than or equal to about 0.3:1.

11. The quantum dot of claim 1, wherein the quantum dot further comprises a semiconductor nanocrystal shell disposed on a core comprising the alloy semiconductor nanocrystal, the semiconductor nanocrystal shell comprising zinc, sulfur, and selenium.

12. The quantum dot of claim 11, wherein in the quantum dot, a mole ratio of sulfur with respect to selenium is less than or equal to about 2.5:1.

13. The quantum dot of claim 11, wherein the semiconductor nanocrystal shell comprises
a first layer comprising a first semiconductor nanocrystal comprising zinc and selenium, and
a second layer disposed on the first layer, the second layer comprising a second semiconductor nanocrystal comprising zinc and sulfur.

14. The quantum dot of claim 13, wherein the first layer does not comprise sulfur and the first layer is disposed directly on a surface of the core, and wherein the second layer is an outermost layer of the quantum dot and the second layer is disposed directly on a surface of the first layer.

15. The quantum dot of claim 1, wherein the alloy semiconductor nanocrystal has a size of greater than or equal to about 2 nanometers.

16. The quantum dot of claim 1, wherein the quantum dot has a size of greater than or equal to about 4 nanometers.

17. The quantum dot of claim 1, wherein the quantum dot has an extinction coefficient per mole at about 450 nanometers of greater than or equal to about $1.2 \times 10^5$ ($M^{-1}$ $cm^{-1}$).

18. The quantum dot of claim 1, wherein in the ultraviolet-visible absorption spectrum of the quantum dot, a ratio of absorbance at 450 nanometers with respect to absorbance at 350 nanometers is greater than or equal to about 0.08:1.

19. The quantum dot of claim 1, wherein the quantum dot emits green light and a maximum luminescent peak wavelength of the green light is in a range of about 500 nanometers to about 560 nanometers.

20. The quantum dot of claim 1, wherein a quantum efficiency of the quantum dot is greater than or equal to about 75%.

21. A method of producing the quantum dot of claim 1, which comprises:
activating a mixture comprising an indium precursor, a zinc precursor, a sulfur precursor, and optionally an organic ligand, in an organic solvent to provide an activated mixture;
adding a gallium precursor and a phosphorus precursor to the activated mixture; and
carrying out a reaction at a reaction temperature to synthesize the alloy semiconductor nanocrystal and produce the quantum dot,
wherein the gallium precursor does not comprise an oxygen containing moiety, a halogen containing moiety, or a combination thereof.

22. The method of claim 21,
wherein the indium precursor comprises a C10 to C40 carboxylate moiety,
wherein the zinc precursor comprises a C10 to C40 carboxylate moiety, and
wherein the sulfur precursor comprises a C1 to C40 alkyl thiol compound.

23. The method of claim 21, wherein the reaction temperature is greater than or equal to about 280° C.

24. A quantum dot polymer composite comprising
a polymer matrix; and
a plurality of quantum dots dispersed in the polymer matrix,
wherein the plurality of quantum dots comprises the quantum dot of claim 1.

25. The quantum dot-polymer composite of claim 24, wherein the polymer matrix comprises a polymerization product of a polymerizable monomer having a carbon-carbon double bond, and optionally a polymerization product of the polymerizable monomer and a thiol compound; and wherein the quantum dot-polymer composite further comprises a metal oxide particulate dispersed in the polymer matrix.

26. The quantum dot-polymer composite of claim 24, wherein the quantum dot polymer composite is in a form of a patterned film.

27. A display device, comprising a light emitting element, wherein the light emitting element comprises the quantum dot-polymer composite of claim 24.

28. The display device of claim 27, wherein the light emitting element comprises a stacked structure comprising
a substrate, and
a light emitting layer disposed on the substrate,
wherein the light emitting layer comprises a pattern comprising the quantum dot-polymer composite, and
wherein the pattern comprises a repeating section emitting light of a predetermined wavelength.

* * * * *